(12) United States Patent
Sasaki

(10) Patent No.: US 11,133,028 B2
(45) Date of Patent: Sep. 28, 2021

(54) MAGNETORESISTANCE EFFECT ELEMENT

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 10 days.

(21) Appl. No.: 16/819,373

(22) Filed: Mar. 16, 2020

(65) Prior Publication Data

US 2020/0219532 A1 Jul. 9, 2020

Related U.S. Application Data

(60) Continuation of application No. 16/250,557, filed on Jan. 17, 2019, now Pat. No. 10,629,231, which is a
(Continued)

(30) Foreign Application Priority Data

Mar. 31, 2015 (JP) .................................. 2015-071410

(51) Int. Cl.
| | |
|---|---|
| *H01L 43/08* | (2006.01) |
| *G11B 5/39* | (2006.01) |
| *H01L 43/10* | (2006.01) |
| *H01L 27/105* | (2006.01) |
| *G11C 11/16* | (2006.01) |

(Continued)

(52) U.S. Cl.
CPC .............. *G11B 5/3909* (2013.01); *G11B 5/39* (2013.01); *G11C 11/161* (2013.01); *H01F 10/1936* (2013.01); *H01L 27/105* (2013.01); *H01L 27/228* (2013.01); *H01L 43/08* (2013.01);
(Continued)

(58) Field of Classification Search
CPC ......... H01L 43/08; H01L 43/10; H01L 43/02; H01L 43/12; H01L 27/222
See application file for complete search history.

(56) References Cited

U.S. PATENT DOCUMENTS

| | | |
|---|---|---|
| 8,520,433 B1 | 8/2013 | Kato et al. |
| 9,520,171 B2 | 12/2016 | Inokuchi et al. |

(Continued)

FOREIGN PATENT DOCUMENTS

| | | |
|---|---|---|
| JP | 2002-173397 A | 6/2002 |
| JP | 2012-060087 A | 3/2012 |

(Continued)

OTHER PUBLICATIONS

May 29, 2020 Office Action issued in U.S. Appl. No. 16/542,462.
(Continued)

*Primary Examiner* — Tony Tran
(74) *Attorney, Agent, or Firm* — Oliff PLC

(57) ABSTRACT

A magnetoresistance effect element has a first ferromagnetic metal layer, a second ferromagnetic metal layer, and a tunnel barrier layer that is sandwiched between the first and second ferromagnetic metal layers, the tunnel barrier layer is expressed by a chemical formula of $AB_2O_x$, and has a spinel structure in which cations are arranged in a disordered manner, A represents a divalent cation that is either Mg or Zn, and B represents a trivalent cation that includes a plurality of elements selected from the group consisting of Al, Ga, and In.

8 Claims, 11 Drawing Sheets

Related U.S. Application Data division of application No. 15/554,410, filed as application No. PCT/JP2016/059884 on Mar. 28, 2016, now Pat. No. 10,224,067.

(51) Int. Cl.
   *H01F 10/193* (2006.01)
   *H01L 27/22* (2006.01)
   *H01F 1/40* (2006.01)

(52) U.S. Cl.
   CPC ...... *H01L 43/10* (2013.01); *G11B 2005/3996* (2013.01); *H01F 1/405* (2013.01)

(56) References Cited

U.S. PATENT DOCUMENTS

| | | | |
|---|---|---|---|
| 10,255,934 | B2 | 4/2019 | Sasaki et al. |
| 2004/0165428 | A1 | 8/2004 | Odagawa et al. |
| 2011/0211272 | A1 | 9/2011 | Butler et al. |
| 2012/0061781 | A1 | 3/2012 | Ohmori et al. |
| 2012/0081950 | A1 | 4/2012 | Slaughter |
| 2012/0091548 | A1 | 4/2012 | Sukegawa et al. |
| 2012/0288963 | A1* | 11/2012 | Nishimura ........... G01R 33/098 438/3 |
| 2013/0221461 | A1 | 8/2013 | Sukegawa et al. |
| 2013/0249026 | A1 | 9/2013 | Kitagawa et al. |
| 2014/0291663 | A1 | 10/2014 | Kuo et al. |
| 2014/0301136 | A1 | 10/2014 | Inokuchi et al. |
| 2015/0357016 | A1 | 12/2015 | Inokuchi et al. |
| 2016/0148975 | A1 | 5/2016 | Kato et al. |
| 2016/0284982 | A1 | 9/2016 | Sasaki et al. |
| 2019/0378974 | A1 | 12/2019 | Sasaki et al. |

FOREIGN PATENT DOCUMENTS

| | | | |
|---|---|---|---|
| JP | 2013-175615 | A | 9/2013 |
| JP | 2013-197406 | A | 9/2013 |
| JP | 5586028 | B2 | 9/2014 |
| JP | 2014-203931 | A | 10/2014 |
| JP | 2015-061043 | A | 3/2015 |
| JP | 2015-090870 | A | 5/2015 |
| WO | 2004/059745 | A1 | 7/2004 |
| WO | 2013/099740 | A1 | 7/2013 |

OTHER PUBLICATIONS

Sukegawa et al, "Post-oxidized Mg—Al—O(001) coherent tunneling barrier in a wide range of resistance-area products", Applied Physics Letters 105, 092403 (Sep. 4, 2014).

Sukegawa et al., "Tunnel magnetoresistance with improved bias voltage dependence in lattice-matched Fe/spinel MgAl2O4/Fe(001) junctions," Applied Physics Letters, 2010, vol. 96, 212505, pp. 1-3.

Scheike et al., "Lattice-matched magnetic tunnel junctions using a Heusler alloy Co2FeAl and a cation-disorder spinel Mg—Al—O barrier," Applied Physics Letters, 2014, vol. 105, 242407, pp. 1-5.

Miura et al., "First-principles study of tunneling magnetoresistance in Fe/MgAl2O4/Fe(001) magnetic tunnel junctions," Physical Review B, 2012, vol. 86, 024426, pp. 1-6.

Sukegawa et al., "Bias voltage dependence in magnetic tunnel junctions with a spinel Mg—Al—O barrier," The 62nd USAP Spring Meeting Koen Yokoshu, Feb. 26, 2015, p. 09-142.

Jun. 14, 2016 International Search Report issued in International Patent Application No. PCT/JP2016/059884.

May 15, 2018 Office Action issued in U.S. Appl. No. 15/554,410.

Apr. 3, 2019 Office Action issued in Chinese Application No. 201680019561.3.

Oct. 11, 2019 Office Action issued in U.S. Appl. No. 16/250,557.

Jun. 14, 2016 International Search Report issued in International Patent Application No. PCT/JP2016/060034.

May 15, 2018 Office Action issued in U.S. Appl. No. 15/554,066.

Masayuki Takagishi; "Magnetoresistance Ratio and Resistance Area Design of CPP-MR Film for 2-5 Tb/in2 Read Sensors;" IEEE Transactions on Magnetics; vol. 46; No. 6; Jun. 2010; pp. 2086-2089.

Jun. 21, 2016 International Search Report issued in International Patent Application No. PCT/JP2016/060067.

Jul. 2, 2018 Office Action issued in U.S. Appl. No. 15/556,261.

Dec. 11, 2019 Office Action issued in U.S. Appl. No. 16/277,045.

Dec. 13, 2019 Notice of Allowance issued in U.S. Appl. No. 16/250,557.

Feb. 7, 2020 Corrected Notice of Allowability issued in U.S. Appl. No. 16/250,557.

U.S. Appl. No. 16/542,462, filed Aug. 16, 2019 in the name of Sasaki et al.

U.S. Appl. No. 16/277,045, filed Feb. 15, 2019 in the name of Sasaki et al.

Mar. 25, 2020 Notice of Allowance Issued in U.S. Appl. No. 16/277,045.

\* cited by examiner

MAGNETORESISTANCE EFFECT ELEMENT

This application is a Continuation of application Ser. No. 16/250,557 filed Jan. 17, 2019, which is a Divisional of application Ser. No. 15/554,410 filed Aug. 29, 2017, which is a National Stage Application of PCT/JP2016/059884 filed Mar. 28, 2016, which claims priority to Japanese Patent Application No. 2015-071410, filed on Mar. 31, 2015, the content of which is incorporated herein by reference.

TECHNICAL FIELD

The present invention relates to a magnetoresistance effect element.

BACKGROUND ART

Giant magnetoresistance (GMR) elements formed of a multi layer film consisting of a ferromagnetic layer and a non-magnetic layer, and tunnel magnetoresistance (TMR) elements using an insulating layer (a tunnel barrier layer or a barrier layer) as a non-magnetic layer have been known. In general, TMR elements have higher element resistance than GMR elements, but a magnetoresistance (MR) ratio of the TMR elements is higher than that of the GMR elements. The TMR elements can be divided into two types. One type is related to TMR elements using only a tunneling effect using an effect of soaking-out of a wave function between ferromagnetic layers. The other type is related to TMR elements using coherent tunneling using conduction in a specific orbit of a non-magnetic insulating layer where tunneling is carried out when the above-described tunneling effect is caused. TMR elements using coherent tunneling have been known to obtain a higher MR ratio than TMR elements using only tunneling. The coherent tunneling effect is caused in a case where both of the ferromagnetic layer and the non-magnetic insulating layer are crystalline and an interface between the ferromagnetic layer and the non-magnetic insulating layer is crystallographically continuous.

Magnetoresistance effect elements are used for various purposes. For example, magnetoresistance effect magnetic sensors have been known as magnetic sensors, and magnetoresistance effect elements determine characteristics of a reproducing function of hard disk drives. Magnetic sensors have a system that detects, as a resistance change of a magnetoresistance effect element, an effect that a magnetization direction of the magnetoresistance effect element is changed by an external magnetic field. Highly anticipated devices are magnetoresistance change-type random access memories (MRAM). MRAMs are memories that read magnetoresistance as digital signals of 0 and 1 by appropriately changing ferromagnetic magnetization directions of two layers to parallel or antiparallel directions.

LITERATURE

Patent Documents

[Patent Document 1] Japanese Patent No. 5586028
[Patent Document 2] Japanese Unexamined Patent Application, First Publication No. 2013-175615

Non-Patent Documents

[Non-Patent Document 1] Hiroaki Sukegawa, a [1] Huixin Xiu, Tadakatsu Ohkubo, Takao Furubayashi, Tomohiko Niizeki, Wenhong Wang, Shinya Kasai, Seiji Mitani, Koichiro Inomata, and Kazuhiro Hono, APPLIED PHYSICS LETTERS 96, 212505 [1] (2010)

[Non-Patent Document 2] Thomas Scheike, Hiroaki Sukegawa, Takao Furubayashi, Zhenchao Wen, Koichiro Inomata, Tadakatsu Ohkubo, Kazuhiro Hono, and Seiji Mitani, Applied Physics Letters, 105,242407 (2014)

[Non-Patent Document 3] Yoshio Miura, Shingo Muramoto, Kazutaka Abe, and Masafumi Shirai, Physical Review B 86, 024426 (2012)

DISCLOSURE OF INVENTION

Problem to be Solved by Invention

In recent years, it has been required to use MgO as a non-magnetic insulating layer in order to cause the coherent tunneling. However, in a case where MgO is used as a non-magnetic insulating layer, there is a problem in that the MR ratio is significantly reduced in a case where a bias voltage to be applied to TMR elements is increased.

Future devices such as magnetic sensors and MRAMs are required to obtain a sufficiently high MR ratio even at a high bias voltage. An index for a reduction in the MR ratio at a bias voltage is $V_{half}$. $V_{half}$ refers to a bias voltage at which the MR ratio at the time of applying a low bias voltage is reduced by half with reference to the low bias voltage. The low bias voltage is, for example, 1 mV. Since the optimum low bias voltage to be obtained varies depending on conditions such as the resistance value of the magnetoresistance effect element, the low bias voltage may be at least equal to or lower than $\frac{1}{10}$ of $V_{half}$.

In a magnetic sensor, an electrical signal obtained as a resistance change in a circuit should be amplified in order to observe a minute magnetic field such as geomagnetism or biomagnetism. In order to realize higher sensitivity than conventional sensors, as well as the MR ratio, an output voltage or an output current should also be increased, and driving at a high bias voltage is also required. In a case of MRAM, high-voltage driving is required in a write operation. In spin transfer torque-type (STT) MRAMs, the more the magnetization direction of a ferromagnetic layer changes, the higher current density is required to be applied to the magnetoresistance effect element.

The magnetization direction of a ferromagnetic layer is an effect of the action of a spin-polarized current on the spin of the ferromagnetic layer. Similarly to the MR ratio, a rewrite-current is generated by a strong spin-polarized current, and thus a high MR ratio is similarly required at a high bias voltage in STT-MRAMs.

In Patent Document 1 and Non Patent Document 1, a tunnel barrier having a spinel structure is reported to be effective as a substituent material for MgO. A spinel tunnel barrier expressed by a composition formula of $MgAl_2O_x$ ($0<x\leq4$) has been known to obtain the same MgO ratio as MgO, and to obtain a higher MR ratio than MgO at a high bias voltage. In addition, in Patent Document 2 and Non Patent Documents 2 and 3, there is a description that $MgAl_2O_4$ is required to have a disordered spinel structure in order to obtain a high MR ratio. The above described disordered spinel structure denotes a structure where oxygen atoms are arranged in cubic close-packed lattice that is substantially similar to spinel lattice, the structure as a whole belongs to a cubic structure, but arrangement of magnesium and aluminum atoms are disordered. In an original ordered spinel, Mg and Al are arranged in order in the tetrahedral vacancies and octahedral vacancies. However, since these are arranged in a random arrangement in the disordered spinel structure, the crystal symmetry of the structure is different from $MgAl_2O_4$, and the lattice constant of the structure is substantially half of 0.808 nm of $MgAl_2O_4$.

The invention is contrived in view of the above-described circumstances, and an object thereof is to provide a magnetoresistance effect element that obtains a higher MR ratio than TMR elements using a conventional spinel tunnel barrier at a high bias voltage.

Means for Solving the Problems

In order to solve the above-described problems, a magnetoresistance effect element according to one aspect of the invention has a first ferromagnetic metal layer, a second ferromagnetic metal layer, and a tunnel barrier layer that is sandwiched between the first and second ferromagnetic metal layers, the tunnel barrier layer is expressed by a chemical formula of $AB_2O_x$, and has a spinel structure in which cations are arranged in a disordered manner, A represents a divalent cation that is either Mg or Zn, and B represents a trivalent cation that includes a plurality of elements selected from the group consisting of Al, Ga, and In.

In a case where a different non-magnetic element is disposed in a trivalent cation site of the spinel structure of the tunnel barrier layer, the basic lattice constant is half the lattice constant of a conventional spinel structure, and the MR ratio is increased.

In the magnetoresistance effect element according to the above aspect, the tunnel barrier layer may have a lattice-matched portion that is lattice-matched with both of the first ferromagnetic metal layer and the second ferromagnetic metal layer, and a lattice-mismatched portion that is not lattice-matched with at least one of the first ferromagnetic metal layer and the second ferromagnetic metal layer.

In the magnetoresistance effect element according to the above aspect, a volume ratio of the lattice-matched portion in the tunnel barrier layer with respect to a volume of the entire tunnel barrier layer may be 65% to 95%.

In a case where the volume ratio of the lattice-matched portion in the tunnel barrier layer is 65% or less, the effect of coherent tunneling is reduced, and thus the MR ratio is reduced. In a case where the volume ratio of the lattice-matched portion in the tunnel barrier layer is 95% or greater, the interference effect between the spin-polarized electrons during passing through the tunnel barrier layer cannot be weakened, and thus an increase in passage of the spin-polarized electrons through the tunnel barrier layer is not observed. By making the number of constituent elements of the non-magnetic element smaller than half the number of elements of the aluminum ion, holes are generated in the cations, the holes and two or more types of non-magnetic elements occupy the cations, and thus lattice periodicity is disturbed. Accordingly, the MR ratio is further increased. In the magnetoresistance effect element according to the above aspect, a difference in ionic radius between the plurality of elements of the trivalent cation constituting B may be $0.2_i$ or less. In a case where the difference in ionic radius is small, the cations are unlikely to be ordered, and thus the lattice constant becomes smaller than that of a general spinel structure. Accordingly, the MR ratio is further increased in a case of two or more types of elements that are similar to each other in ionic radius.

In the magnetoresistance effect element according to the above aspect, the number of constituent elements in a unit cell of the divalent cation may be smaller than half that of the trivalent cation. By making the number of constituent elements of the non-magnetic element smaller than half that of the trivalent cation, holes are generated in the cations, the holes and two or more types of non-magnetic elements occupy the cations, and thus lattice periodicity is disturbed. Accordingly, the MR ratio is increased.

In the magnetoresistance effect element according to the above aspect, a magnetoresistance ratio may be 100% or greater under application of a voltage of 1 V or greater at a room temperature. The magnetoresistance effect element can also be used in devices to which a high bias voltage is applied, such as high-sensitivity magnetic sensors, logic-in-memories, and MRAMs.

In the magnetoresistance effect element according to the above aspect, the first ferromagnetic metal layer may have larger coercivity than the second ferromagnetic metal layer. Since the coercivity of the first ferromagnetic metal layer is different from that of the second ferromagnetic metal layer, the element functions as a spin valve, and device application is possible.

In the magnetoresistance effect element according to the above aspect, at least one of the first ferromagnetic metal layer and the second ferromagnetic metal layer may have magnetic anisotropy perpendicular to a stacking direction. Since it is not necessary to apply a bias magnetic field, it is possible to reduce the device in size. In addition, the element can be allowed to function as a recording element since it has high thermal disturbance resistance.

In the magnetoresistance effect element according to the above aspect, at least one of the first ferromagnetic metal layer and the second ferromagnetic metal layer may be $Co_2Mn_{1-a}Fe_aAl_bSi_{1-b}$ ($0 \le a \le 1$, $0 \le b \le 1$). $Co_2Mn_{1-a}Fe_aAl_bSi_{1-b}$ is a ferromagnetic metal material having high spin polarizability, and a higher MR ratio can be obtained than in a case where another ferromagnetic metal material is used.

In the magnetoresistance effect element according to the above aspect, in the trivalent cation, a proportion of any one of Al, Ga, or In as a main component may be 85% to less than 100%. In a region where the proportion of any one of Al, Ga, or In as a main component is 85% to less than 100%, RA is lower than in a case where the proportion of the main component is 100%. Regarding this, it can be thought that the substituted element imparts distortion to the crystal lattice, and thus a component contributing to conduction is imparted. Otherwise, the substituted element is thought to form an impurity level in a bandgap and to contribute to conduction.

Effects of the Invention

According to the above aspects of the present invention, it is possible to provide a magnetoresistance effect element that obtains a higher MR ratio than TMR elements using a conventional spinel tunnel barrier at a high bias voltage.

BRIEF DESCRIPTION OF DRAWINGS

FIG. 21(A) shows a high-resolution cross-section TEM. FIG. 21(B) shows an example of an image obtained by performing inverse Fourier analysis.

FIG. 23(A) is a diagram showing element resistance (Rp) when magnetization directions of the first ferromagnetic metal layer and the second ferromagnetic metal layer are parallel to each other. FIG. 23(B) is a diagram showing element resistance (Rap) when magnetization directions of the first ferromagnetic metal layer and the second ferromagnetic metal layer are anti parallel to each other. FIG. 23(C) is a diagram showing a magnetoresistance ratio of the element.

EMBODIMENTS FOR CARRYING OUT THE INVENTION

Figure 1:
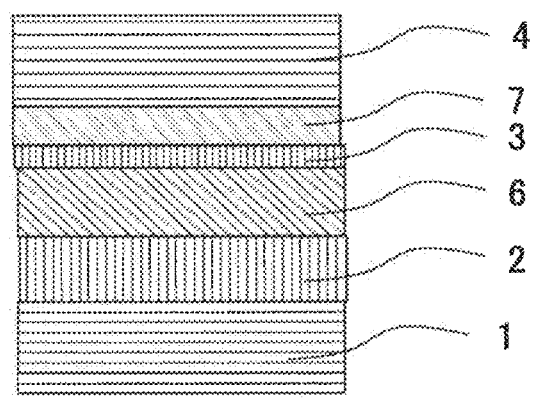
FIG. 1 shows a stacked structure of a magnetoresistance effect element.
Figure 1:

Hereinafter, embodiments of the invention will be described in detail with reference to the accompanying drawings. In the description of the drawings, the same elements will be denoted by the same reference numerals, and an overlapping description thereof will be omitted.

First Embodiment

Hereinafter, a case where a magnetoresistance effect element according to a first embodiment has a first ferromagnetic metal layer 6, a second ferromagnetic metal layer 7, and a tunnel barrier layer 3 sandwiched between the first and second ferromagnetic metal layers, and the tunnel barrier layer 3 is expressed by a chemical formula of $AB_2O_x$ ($0<x\leq4$), has a spinel structure in which cations are arranged in a disordered manner, and contains a divalent cation that is either Mg or Zn and a trivalent cation that includes a plurality of elements selected from the group consisting of Al, Ga, and In will be described.

(Basic Structure)

In the example shown in FIG. 1, a magnetoresistance effect element 100 is provided on a substrate 1, and has a stacked structure provided with an underlayer 2, a first ferromagnetic metal layer 6, a tunnel barrier layer 3, a second ferromagnetic metal layer 7, and a cap layer 4 in order from the substrate 1.

(Tunnel Barrier Layer)

The tunnel barrier layer 3 is made of a non-magnetic insulating material. In general, the tunnel barrier layer has a film thickness of 3 nm or less, and in a case where the tunnel barrier layer is sandwiched between metal materials, a wave function of electrons of atoms of the metal materials extends beyond the tunnel barrier layer 3, and thus a current may flow regardless of the presence of an insulating material on the circuit. The magnetoresistance effect element 100 is classified into two types including: a type in which the typical tunneling effect is used; and a type in which the coherent tunneling effect where an orbit for tunneling is limited is predominant. In the typical tunneling effect, a magnetoresistance effect is obtained by spin polarization of ferromagnetic materials. On the other hand, in the coherent tunneling, an orbit for tunneling is limited. Therefore, in a magnetoresistance effect element in which coherent tunneling is predominant, an effect higher than or equivalent to spin polarization of ferromagnetic metal materials can be expected. In order to exhibit the coherent tunneling effect, it is necessary that the ferromagnetic metal materials and the tunnel barrier layer 3 be crystallized and joined in a specific orientation.

(Spinel Structure)

Figure 2:
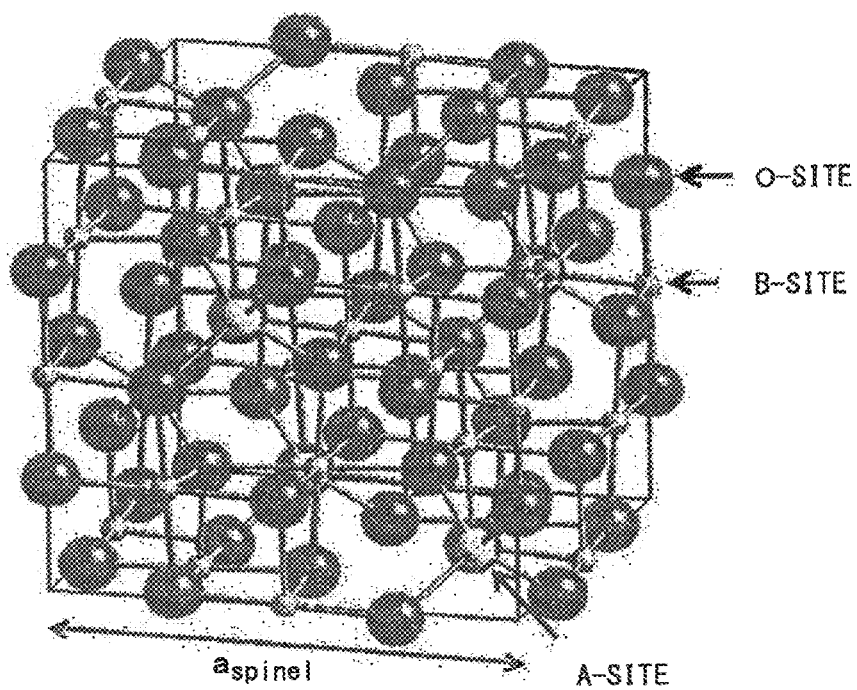
FIG. 2 is a diagram of a crystal structure of a spinel.
Figure 3:
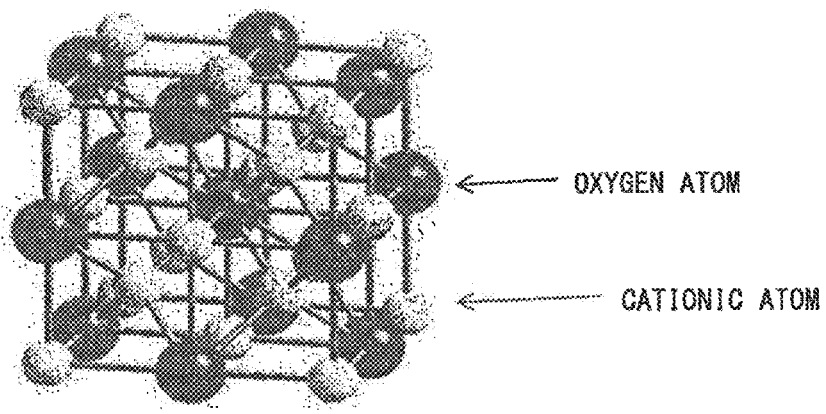
FIG. 3 is a schematic diagram of an ordered spinel structure and a disordered spinel structure with symmetry of Fm-3 m having a lattice constant assumed in a tunnel barrier layer of the invention.
Figure 4:
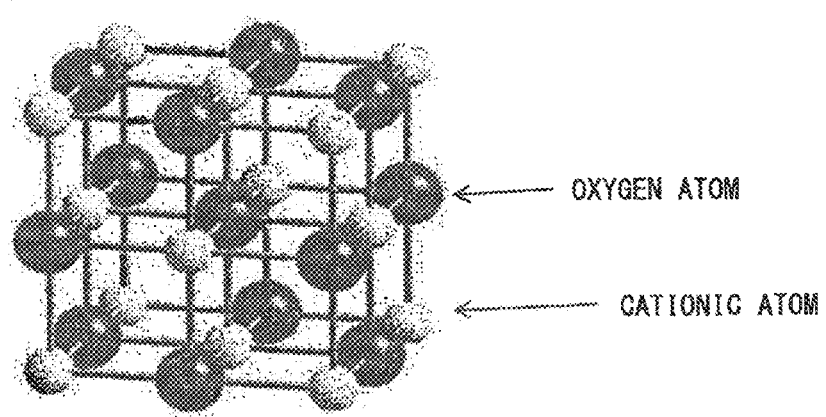
FIG. 4 is a schematic diagram of an ordered spinel structure and a disordered spinel structure with symmetry of Fm-3 m having a lattice constant assumed in a tunnel barrier layer of the invention.
Figure 5:
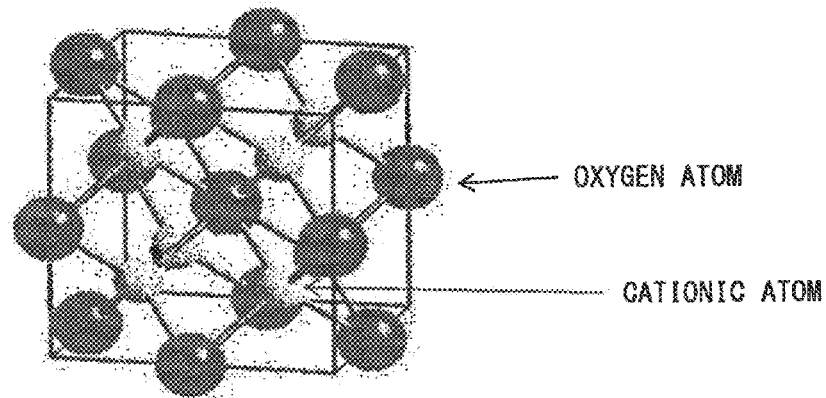
FIG. 5 is a schematic diagram of an ordered spinel structure and a disordered spinel structure with symmetry of Fm-3 m having a lattice constant assumed in a tunnel barrier layer of the invention.
Figure 6:
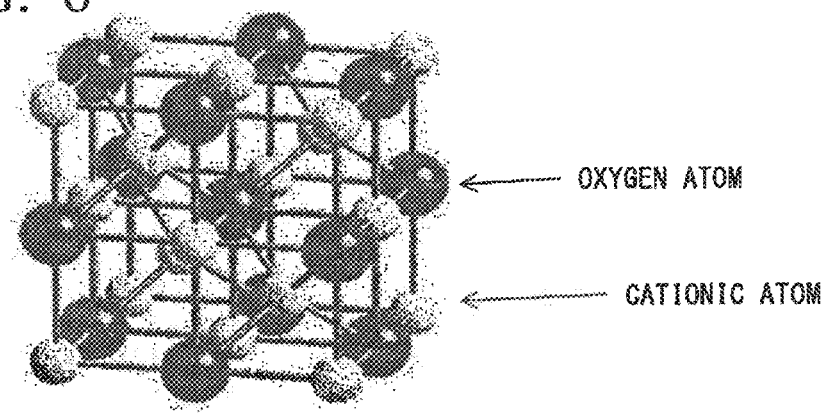
FIG. 6 is a schematic diagram of an ordered spinel structure and a disordered spinel structure with symmetry of F-43 m having a lattice constant assumed in a tunnel barrier layer of the invention.
Figure 7:
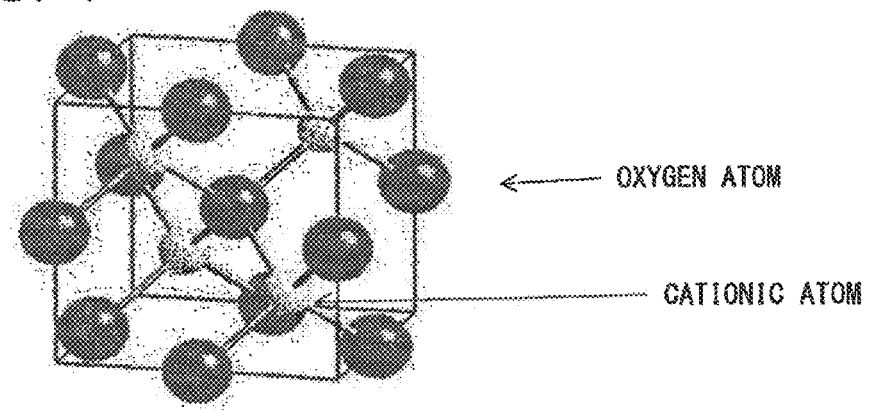
FIG. 7 is a schematic diagram of an ordered spinel structure and a disordered spinel structure with symmetry of F-43 m having a lattice constant assumed in a tunnel barrier layer of the invention.

FIG. 2 shows a spinel structure. A n A-site in which oxygen is fourfold coordinated to cations and a B-site in which oxygen is six fold coordinated to cations exist. Here, a Sukenel structure referring to the spinel structure in which cations are disordered is a structure that has a lattice constant half the lattice constant of an ordered spinel structure while a position of an oxygen atom of the ordered spinel is almost not changed, and in which cations are positioned in tetrahedral positions and octahedral positions of oxygen atoms that are not occupied under ordinary circumstances. At this time, this structure may include total five structures shown in FIGS. 3 to 7, and may be any one of them or a mixed structure thereof.

(Definition of Disordered Spinel Structure)

In this specification, the spinel structure in which cations are disordered may be referred to as a Sukenel structure. The Sukenel structure refers to a structure where oxygen atoms are arranged in cubic close-packed lattice that is substantially similar to spinel lattice, the structure as a whole belongs to a cubic structure, but arrangement of cations are disordered. In an original ordered spinel, Mg and Al are arranged in order in the tetrahedral vacancies and octahedral vacancies in the original spinel. However, since these are arranged in random arrangement in the Sukenel structure, the crystal symmetry of the structure is different from $MgAl_2O_4$, and the lattice constant of the structure is substantially half of that of $MgAl_2O_4$. With a change in the lattice-repeating unit, a combination between the ferromagnetic layer material and the electronic structure (band structure) is changed, and thus a large TMR enhancement due to a coherent tunneling effect is obtained. For example, a space group of $MgAl_2O_4$ that is a non-magnetic spinel material is Fd-3 m, but a space group of a disordered spinel structure with a lattice constant reduced by half is known to be changed to Fm-3 m or F-43 m, and there are total five structures (Non-Patent Document 2). Any one of them can be used.

In this specification, the Sukenel structure is not essentially required to be a cubic structure. In the stacked structure, the crystal structure is influenced by the crystal structure of the material of an underlayer, and the lattice is thus partially distorted. Each material has a bulk crystal structure, but in a case where it is formed into a thin film, a partially distorted crystal structure based on the bulk crystal structure can be taken. Particularly, in the invention, the tunnel barrier layer has a very thin structure, and is easily influenced by the crystal structure of the layer brought into contact with the tunnel barrier layer. In this regard, the bulk crystal structure of a Sukenel structure is a cubic structure, and in this specification, the Sukenel structure includes a Sukenel structure which does not have a cubic structure in addition to a Sukenel structure slightly deviating from the cubic structure. A deviation from the cubic structure in the Sukenel structure described in this specification is generally slight, and this deviation depends on the accuracy of a measurement method for evaluating the structure.

The divalent cation (A-site) in the non-magnetic element of the tunnel barrier layer is either magnesium or zinc. These non-magnetic elements are stable in a case where the number of valence is 2, and in a case where these non-magnetic elements are constituent elements of the tunnel barrier layer, coherent tunneling can be realized, and the MR ratio is increased.

The trivalent cation (B-site) in the non-magnetic element of the tunnel barrier layer includes at least two types of elements selected from the group consisting of aluminum, gallium, and indium. These non-magnetic elements are stable in a case where the number of valence is 3, and in a case where these non-magnetic elements are constituent elements of the tunnel barrier layer, coherent tunneling can be realized, and the MR ratio is increased.

A difference in ionic radius between the trivalent cations of the plurality of non-magnetic elements of the tunnel barrier layer may be 0.2 A or less. In a case where the difference in ionic radius is small, the cations are unlikely to be ordered, and thus the lattice constant becomes smaller than that of a general spinel structure. Accordingly, the MR ratio is further increased in a case of two or more types of elements that are similar to each other in ionic radius.

In the trivalent cations of the tunnel barrier layer, the proportion of any one of Al, Ga, or In as a main component may be 85% to less than 100%. In a region where the proportion of any one of Al, Ga, or In as a main component is 85% to less than 100%, RA is lower than in a case where the proportion of the main component is 100%. Regarding this, it can be thought that the substituted element imparts distortion to the crystal lattice, and thus a component contributing to conduction is imparted. Otherwise, the substituted element is thought to form an impurity level in a bandgap and to contribute to conduction.

(First Ferromagnetic Metal Layer)

Examples of the material of the first ferromagnetic metal layer 6 include metal selected from the group consisting of Cr, Mn, Co, Fe, and Ni, alloy including one or more of the metals of the group, and alloy including one or more metals selected from the group and at least one element of B, C, and N. Specific examples thereof include Co—Fe and Co—Fe—B. A Heusler alloy such as $Co_2FeSi$ is preferable in order to obtain a high output. The Heusler alloy includes inter metallic compounds having a chemical composition of $X_2YZ$. X denotes a Co, Fe, Ni, or C u group transition metal element or noble metal in the periodic table, Y denotes a Mn, V, Cr, or Ti group transition metal, and can also take the elemental species of X, and Z denotes representative elements of III to V groups. Examples thereof include $Co_2FeSi$, $Co_2MnSi$, and $Co_2Mn_{1-a}Fe_aAl_bSi_{1-b}$. In addition, an antiferromagnetic material such as IrMn and PtMn may be used as a material brought into contact with the first ferromagnetic metal layer 6 in order to make coercivity of the first ferromagnetic metal layer larger than that of the second ferromagnetic metal layer 7. Furthermore, the first ferromagnetic metal layer may have a synthetic ferromagnetic coupling structure such that the second ferromagnetic metal layer 7 is not influenced by a leakage magnetic field of the first ferromagnetic metal layer 6.

In a case where a magnetization direction of the first ferromagnetic metal layer 6 is made perpendicular to the stacked plane, a stacked film of Co and Pt is preferably used. For example, in a case where the first ferromagnetic metal layer 6 has a composition of [Co (0.24 nm)/Pt (0.16 nm)]$_6$/Ru (0.9 nm)/[Pt (0.16 nm)/Co (0.16 nm)]$_4$/Ta (0.2 nm)/FeB (1.0 nm), the magnetization direction can be made perpendicular to the stacked plane.

(Second Ferromagnetic Metal Layer)

A ferromagnetic material, particularly, a soft magnetic material is applied as a material of the second ferromagnetic metal layer 7, and examples thereof include metal selected from the group consisting of Cr, Mn, Co, Fe, and Ni, alloy including one or more of the metals of the group, and alloy including one or more metals selected from the group and at least one element of B, C, and N. Specific examples thereof include Co—Fe, Co—Fe—B, and Ni—Fe.

In a case where a magnetization direction of the second ferromagnetic metal layer 7 is made perpendicular to the stacked plane, the second ferromagnetic metal layer 7 preferably has a thickness of 2.5 nm or less. Perpendicular magnetic anisotropy can be applied to the second ferromagnetic metal layer 7 at an interface between the second ferromagnetic metal layer 7 and the tunnel barrier layer 3. The second ferromagnetic metal layer 7 preferably has a thin film thickness since the effect of the perpendicular magnetic anisotropy is reduced if the second ferromagnetic metal layer 7 has a thick film thickness.

In general, the first ferromagnetic metal layer 6 has a structure in which the magnetization direction thereof is fixed, and is called a fixed layer. In addition, since the second ferromagnetic metal layer 7 has a magnetization direction that can be more easily changed by an external magnetic field or a spin torque than the first ferromagnetic metal layer 6, the second ferromagnetic metal layer is called a free layer.

(Substrate)

A magnetoresistance effect element according to the invention may be formed on a substrate.

In that case, a material showing excellent flatness is preferably used as a material of the substrate 1. The substrate 1 differs depending on the purpose. For example, in a case of MRAM, a circuit formed in a Si substrate can be used under the magnetoresistance effect element. In a case of a magnetic head, an AlTiC substrate that can be easily processed can be used.

(Underlayer)

In a case where a magnetoresistance effect element according to the invention is formed on a substrate, first, an underlayer may be formed on the substrate.

In that case, the underlayer 2 is used to control crystallinity such as crystal orientation and crystal grain size of the first ferromagnetic metal layer 6 and layers formed above the first ferromagnetic metal layer 6. Therefore, it is important to select the material of the underlayer 2. Hereinafter, the material and the configuration of the underlayer 2 will be described. Any of a conductive material and an insulating material may be used for the underlayer, but in a case where electric power is fed to the underlayer, a conductive material is preferably used. First, as a first example of the underlayer 2, a nitride layer having a (001)-oriented NaCl structure and containing at least one element selected from the group consisting of Ti, Zr, Nb, V, Hf, Ta, Mo, W, B, Al, and Ce is exemplified. As a second example of the underlayer 2, a (002)-oriented perovskite conductive oxide layer made of $ABO_3$ is exemplified. Here, the A-site includes at least one element selected from the group consisting of Sr, Ce, Dy, La, K, Ca, Na, Pb, and Ba, and the B-site includes at least one element selected from the group consisting of Ti, V, Cr, Mn, Fe, Co, Ni, Ga, Nb, Mo, Ru, Ir, Ta, Ce, and Pb. As a third example of the underlayer 2, an oxide layer having a (001)-oriented NaCl structure and containing at least one element selected from the group consisting of Mg, Al, and Ce is exemplified. As a fourth example of the underlayer 2, a layer having a (001)-oriented tetragonal or cubic structure and containing at least one element selected from the group consisting of Al, Cr, Fe, Co, Rh, Pd, Ag, Ir, Pt, Au, Mo, and W is exemplified. As a fifth example of the underlayer 2, a layer having a stacked structure with a combination of two or more of the layers of the above first to fourth examples is exemplified. By devising the structure of the underlayer as described above, it is possible to control the crystallinity of the ferromagnetic layer 2 and layers formed above the ferromagnetic layer 2, thereby improving the magnetic characteristics.

(Cap Layer)

A cap layer may be formed on the second ferromagnetic metal layer of the magnetoresistance effect element according to the invention.

A cap layer 4 is installed above the second ferromagnetic metal layer 7 in a stacking direction in order to control crystallinity such as crystal orientation and crystal grain size and element diffusion. In a case where a free layer having a bcc structure is formed, the crystal structure of the cap layer may be any one of a fcc structure, a hcp structure, and a bcc structure. In a case where a free layer having a fcc structure is formed, the crystal structure of the cap layer may be any one of a fcc structure, a hcp structure, and a bcc structure. The film thickness of the cap layer may be within such a range that a distortion relaxation effect is obtained and a reduction in the MR ratio by shunt is not shown. The film thickness of the cap layer is preferably 1 nm to 30 nm.

(Shape and Dimensions of Element)

A laminate formed of the first ferromagnetic metal layer, the tunnel barrier layer, and the second ferromagnetic metal layer 2 constituting the invention has a columnar shape. In addition, it may have various shapes such as a circular shape, a square shape, a triangle shape, and a polygonal shape when viewed from top, and preferably has a circular shape from the viewpoint of symmetry. That is, the laminate preferably has a columnar shape.

Figure 8:
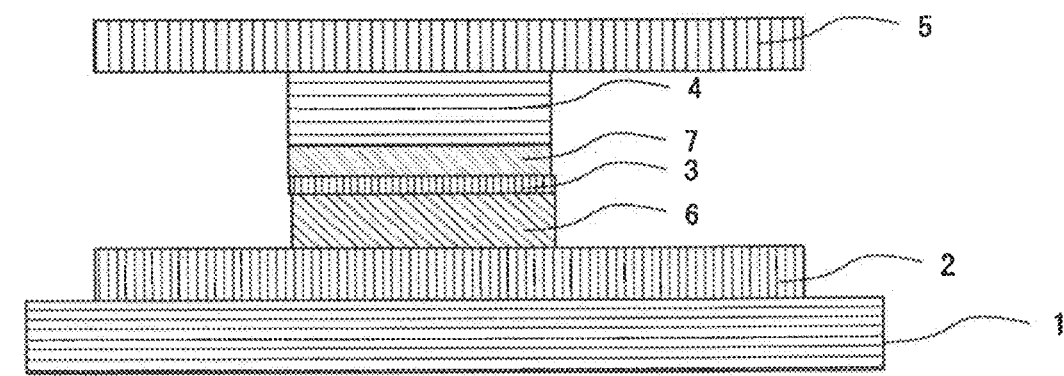
FIG. 8 is a diagram showing a structure to be evaluated of a magnetoresistance effect element according to an embodiment in a direction perpendicular to a stacking direction.
Figure 8:
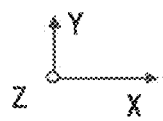
Figure 9:
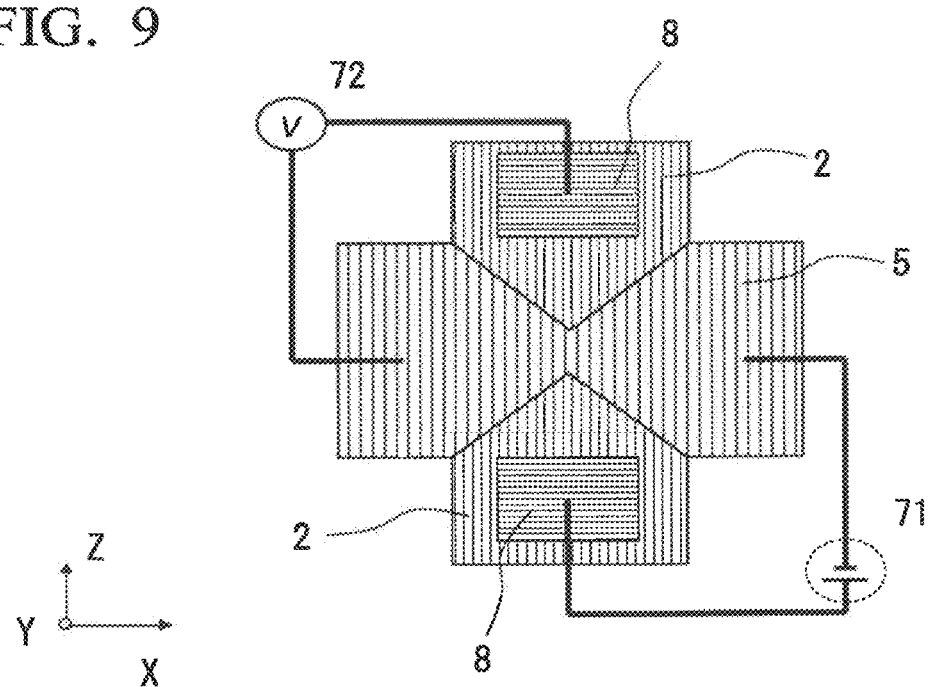
FIG. 9 is a diagram showing the element structure according to the embodiment when seen from the stacking direction.

FIGS. 8 and 9 show examples of the shape and the dimensions of the magnetoresistance effect element.

FIG. 8 is a diagram showing a structure when viewed from a side in a stacking direction of the magnetoresistance effect element 100. The magnetoresistance effect element 100 of FIG. 8 has an electrode layer 5 formed above the cap layer 4 shown in FIG. 1. FIG. 9 is a diagram showing a structure when viewed in the stacking direction of the magnetoresistance effect element 100. In FIG. 9, a current source 71 and a voltmeter 72 are also shown.

The magnetoresistance effect element 100 is processed into a columnar shape of 80 nm or less as shown in FIGS. 8 and 9, and wiring is applied. Since the magnetoresistance effect element 100 is processed into a columnar shape having a size of 80 nm or less, a domain structure is not likely to be formed in the ferromagnetic metal layers, and it is not necessary to consider a component having a different spin polarization in the ferromagnetic metal layers. In FIG. 9, the magnetoresistance effect element 100 is disposed at a position where the underlayer 2 and the electrode layer 5 intersect each other.

(Evaluation Method)

The magnetoresistance effect element 100 can be evaluated with the structure shown in FIGS. 8 and 9. For example, the power supply 71 and the voltmeter 72 are disposed as shown in FIG. 9 such that a fixed current or a fixed voltage is applied to the magnetoresistance effect element 100. By measuring the voltage or the current while sweeping an external magnetic field, a change in the resistance of the magnetoresistance effect element 100 can be measured.

In general, the MR ratio is expressed by the following formula.

$$\text{MR Ratio}(\%) = \{(R_{AP} - R_p)/R_p\} \times 100$$

$R_p$ denotes a resistance in a case where magnetization directions of the first ferromagnetic metal layer 6 and the second ferromagnetic metal 7 are parallel to each other, and $R_{AP}$ denotes a resistance in a case where magnetization directions of the first ferromagnetic metal layer 6 and the second ferromagnetic metal 7 are anti parallel to each other.

In a case where a strong current flows in the magnetoresistance effect element 100, magnetization rotation occurs by a STT effect, and a resistance value of the magnetoresistance effect element 100 is rapidly changed. The current value at which the resistance value is rapidly changed is called an inversion current value ($J_c$).

(Others)

In this example, a structure in which the first ferromagnetic metal layer 6 having high coercivity is disposed on the lower side is an exemplary example of this structure, but the invention is not limited to this structure. In a case of a structure in which the first ferromagnetic metal layer 6 having high coercivity is disposed on the upper side, the coercivity is reduced in comparison with a case in which the first ferromagnetic metal layer 6 is disposed on the lower side, but the tunnel barrier layer 3 can be formed by utilizing the crystallinity of the substrate, and thus the MR ratio can be increased.

In order to utilize the magnetoresistance effect element as a magnetic sensor, a resistance change preferably changes linearly with respect to an external magnetic field. In a general stacked film of ferromagnetic layers, magnetization directions are easily directed into the stacked plane by shape anisotropy. In this case, for example, a magnetic field is applied from outside to make the magnetization directions of the first ferromagnetic metal layer and the second ferromagnetic metal layer intersect each other, thereby changing the resistance change linearly with respect to the external magnetic field. However, in this case, since a mechanism that applies a magnetic field is required near the magnetoresistance effect element, this is not preferable for integration. In a case where the ferromagnetic metal layer itself has perpendicular magnetic anisotropy, this is advantageous for integration since a method such as application of a magnetic field from outside is not required.

The magnetoresistance effect element using this embodiment can be used as a magnetic sensor or a memory such as a MRAM. Particularly, this embodiment is effective for products that are used with a bias voltage higher than a bias voltage used in conventional magnetic sensors.

(Manufacturing Method)

The magnetoresistance effect element 100 can be formed using, for example, a magnetron sputtering apparatus.

The tunnel barrier layer 3 can be produced through a known method. For example, a thin metal film is formed on the first ferromagnetic metal layer 6 by sputtering, performing plasma oxidation or natural oxidation by oxygen introduction thereon; and performing a heat treatment thereon. As the film-forming method, not only a magnetron sputtering method but also a thin film-forming method such as a vapor deposition method, a laser ablation method, or a MBE method can be used.

Each of the underlayer, the first ferromagnetic metal layer, the second ferromagnetic metal layer, and the cap layer can be formed through a known method.

Second Embodiment

A second embodiment is different from the first embodiment only in the method of forming a tunnel barrier layer. In the first embodiment, the tunnel barrier layer is formed by repeatedly performing formation and oxidation of a metal film. In the second embodiment, the substrate temperature is lowered to −70 to −30 degrees, and then oxidation is performed in the oxidation step. By cooling the substrate, a temperature gradient is generated between the substrate and the vacuum or between the substrate and the plasma. First, in a case where a surface of the substrate is exposed to oxygen, oxygen reacts with the metal material and the metal material is oxidized. However, the oxidation does not proceed due to the low temperature. Accordingly, the oxygen amount of the tunnel barrier layer is easily adjusted. Moreover, by forming the temperature gradient, epitaxial growth (lattice-matched growth) is easily adjusted. Since the crystal growth proceeds by the temperature gradient, the epitaxial growth is easily performed in a case where the temperature of the substrate is sufficiently lowered. As the temperature of the substrate is increased, domains are formed and a plurality of crystal nuclei are thus formed in the plane. Each of the crystal nuclei is independently and epitaxially grown, and thus a part in which lattices are not matched is formed in a part in which the grown domains are in contact with each other.

It is preferable that in the tunnel barrier layer, lattice-matched parts, which are lattice-matched with both of a first ferromagnetic metal layer and a second ferromagnetic metal layer, partially exist. In general, it is preferable that the tunnel barrier layer be completely lattice-matched to both of the first ferromagnetic metal layer and the second ferromagnetic metal layer. However, in a case where the tunnel barrier layer is completely lattice-matched, spin-polarized electrons interfere with each other during passing through the tunnel barrier layer, and thus the electrons do not easily pass through the tunnel barrier layer. In contrast, in a case where lattice-matched parts, in which lattices are matched, partially exist, the interference between spin-polarized electrons during passing through the tunnel barrier layer is appropriately cut in parts in which lattices are not matched, and thus the spin-polarized electrons easily pass through the tunnel barrier layer. The volume ratio of the lattice-matched part portion in the tunnel barrier layer with respect to the volume of the entire tunnel barrier layer is preferably 65% to 95%. In a case where the volume ratio of the lattice-matched part in the tunnel barrier layer is 65% or less, the effect of coherent tunneling is reduced, and thus the MR ratio decreases. In a case where the volume ratio of the lattice-matched part in the tunnel barrier layer is 95% or greater, the interference effect between the spin-polarized electrons during passing through the tunnel barrier layer is not be weakened, and thus an increase in passage of the spin-polarized electrons through the tunnel barrier layer is not observed.

(Method of Calculating Volume Ratio of Lattice-Matched Portion)

The volume ratio of the lattice-matched part (lattice-matched portion) with respect to the volume of the entire tunnel barrier layer can be estimated from, for example, a TEM image. Regarding whether the lattices are matched, a part including the tunnel barrier layer, the first ferromagnetic metal layer, and the second ferromagnetic metal layer in a cross-section TEM image is Fourier-transformed to obtain an electron beam diffraction image. In the electron beam diffraction image obtained by Fourier transformation, electron beam diffraction spots in directions other than the stacking direction are removed. That image is subjected to inverse Fourier transformation to provide an image in which information only in the stacking direction is obtained. In lattice lines in the inverse Fourier image, a part in which the tunnel barrier layer is continuously connected to both of the first ferromagnetic metal layer and the second ferromagnetic metal layer is defined as a lattice-matched portion. In addition, in lattice lines, a part in which the tunnel barrier layer is not continuously connected to at least one of the first ferromagnetic metal layer and the second ferromagnetic metal layer, or in which no lattice lines are detected is defined as a lattice-mismatched portion. In the lattice-matched portion, in the lattice lines in the inverse Fourier image, the layers are continuously connected from the first ferromagnetic metal layer to the second ferromagnetic metal layer via the tunnel barrier layer, and thus a width ($L_C$) of the lattice-matched portion can be measured from the TEM image. Similarly, in the lattice-mismatched portion, in the lattice lines in the inverse Fourier image, the layers are not continuously connected, and thus a width ($L_I$) of the lattice-mismatched portion can be measured from the TEM image. Using the width ($L_C$) of the lattice-matched portion as a numerator and using the sum of the width ($L_C$) of the lattice-matched portion and the width ($L_I$) of the lattice-mismatched portion as a denominator, the volume ratio of the lattice-matched portion with respect to the volume of the entire tunnel barrier layer can be obtained. The TEM image is a cross-section image, but includes information including a depth. Accordingly, it can be thought that the region estimated from the TEM image is proportional to the volume.

Figure 21A:
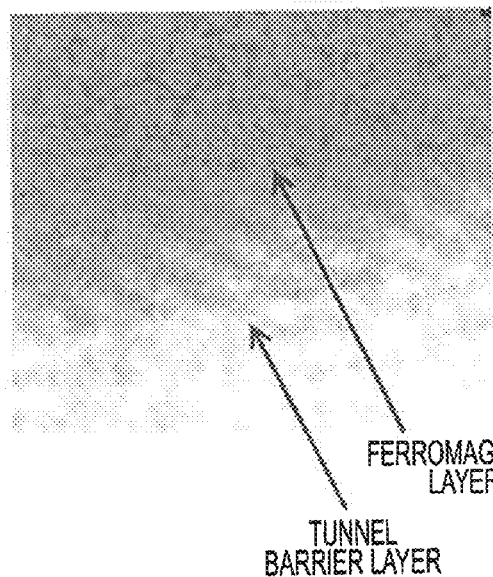
FIGS. 21(A) and 21(B) show an example of a part in which the tunnel barrier layer and the ferromagnetic metal layer are lattice-matched.
Figure 21B:
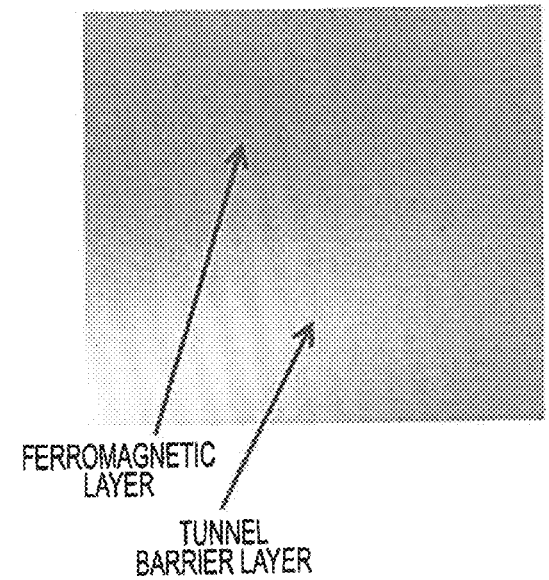

FIGS. 21(A) and 21(B) show an example of the part in which the tunnel barrier layer and the ferromagnetic metal layer are lattice-matched. FIG. 21(A) shows an example of a high-resolution cross-section TEM image. FIG. 21(B) shows an example of an image obtained by performing inverse Fourier transformation after removal of electron beam diffraction spots in directions other than the stacking direction in the electron beam diffraction image. In FIG. 21(B), components perpendicular to the stacking direction are removed, and thus lattice lines can be observed in the stacking direction. This shows that the tunnel barrier layer and the ferromagnetic metal layer are continuously connected to each other without interruption at an interface therebetween.

EXAMPLES

Example 1

Hereinafter, an example of the method of manufacturing a magnetoresistance effect element according to the first embodiment will be described. Film formation was performed on a substrate provided with a thermal silicon oxide film using a magnetron sputtering method. As an underlayer, 5 nm of Ta/3 nm of R u was formed, and as a first ferromagnetic metal layer, 12 nm of IrM n/10 nm of C oF e/0.8 nm of Ru/7 nm of CoFe was formed in this order on the underlayer. Next, a method of forming a tunnel barrier layer will be shown. A film of 0.1 nm of Mg/0.4 nm of $Mg_{0.5}Al_{1.0}Ga_{1.1}In_{0.9}$ was formed by sputtering with a Mg target and a target having an alloy composition of $Mg_{0.5}Al_{1.0}Ga_{1.1}In_{0.9}$. T hereafter, the above-described sample was moved to an oxidation chamber of which the inside was kept in an ultrahigh vacuum of $1\times10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a film of 0.05 nm of Mg/0.3 nm of $Mg_{0.5}Al_{1.0}Ga_{1.1}In_{0.9}$/0.05 nm of Mg was formed. The above-described sample was moved to the oxidation chamber of which the inside was kept in an ultrahigh vacuum of $1\times10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

The above-described stacked film was moved again to the film-forming chamber, and a 5 nm CoFe film was formed as a second ferromagnetic metal layer 7. 3 nm of Ru/5 nm of Ta was formed as a cap layer 4.

The above-described stacked film was installed in an annealing apparatus, and heated at a temperature of 450° C. in Ar atmosphere for 10 minutes. Thereafter, under an applied field of 8 kOe, a heat treatment was performed on the stacked film at 280 degrees for 6 hours.

Next, an element was formed as in FIG. 9. First, a photoresist was formed using electron beam lithography in such a way that the electrode layer was in a direction rotated by 90 degrees as in FIG. 9. A part other than a part below the photoresist was eliminated by an ion milling method to expose the thermal silicon oxide film that was the substrate, and thus a shape of the underlayer 2 was formed. In a narrow part in the shape of the underlayer, a photoresist was formed into a columnar shape of 80 nm using electron beam lithography, and a part other than a part below the photoresist was eliminated by an ion milling method to expose the underlayer. Thereafter, SiOx was formed as an insulating layer on the part shaved by ion milling. Here, the photoresist with a columnar shape of 80 nm was removed. The photoresist was not formed only in a part corresponding to an electrode pad of FIG. 9, and the insulating layer was removed by an ion milling method to expose the underlayer. T hereafter, an Au layer was formed. This electrode pad 8 functions as a contact electrode for the underlayer of the above-described stacked film. Next, a photoresist was formed and shaping was performed by an ion milling method such that the electrode layer of FIG. 9 was formed, and an Au film was formed. This functions as a contact electrode for the electrode layer of the above-described stacked film.

Characteristic Evaluation of Example 1

Figure 10:
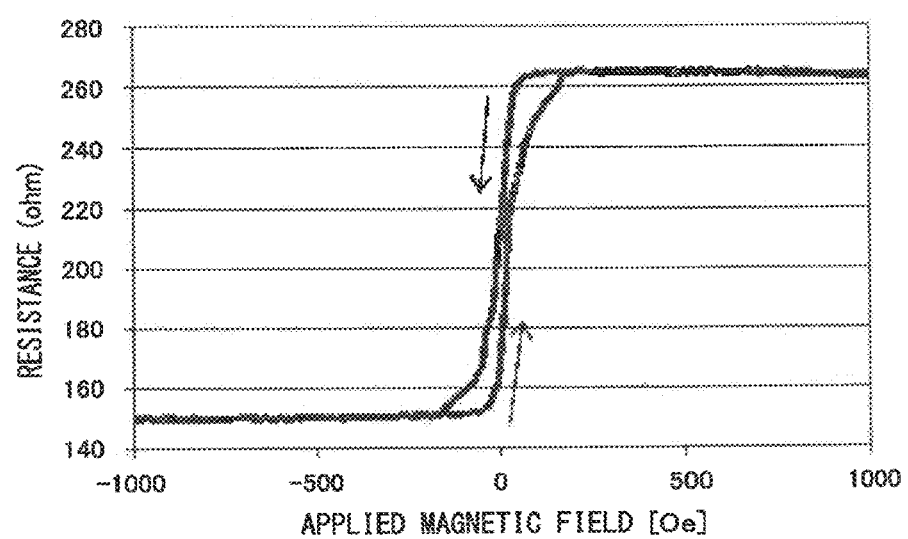
FIG. 10 is a graph showing results of evaluation of a magnetoresistance effect of a magnetoresistance effect element of Example 1.
Figure 11:
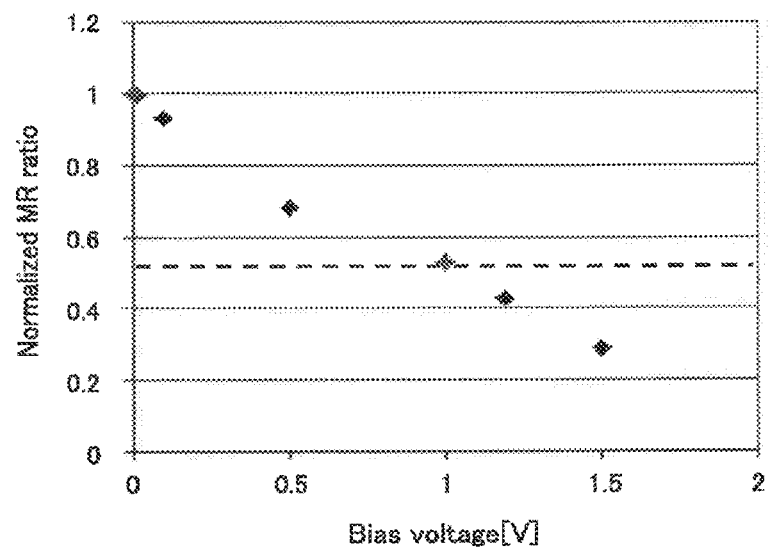
FIG. 11 is a diagram showing results of evaluation of bias voltage dependency of the magnetoresistance effect of the magnetoresistance effect element of Example 1.

The magnetoresistance effect element evaluation method is based on a magnetoresistance effect element evaluation method that has been generally performed. As shown in FIG. 9, a current source and a voltmeter were connected to the electrode pad and the electrode layer, respectively, to perform measurement by a four-terminal method. A bias voltage to be applied from the voltmeter was appropriately changed to 10 to 1500 mV, and a current was measured by the current source to obtain a resistance value. The changing resistance value was observed by applying a magnetic field to the magnetoresistance effect element from outside. FIG. 10 is a diagram showing results of the evaluation of the magnetoresistance effect of the magnetoresistance effect element of Example 1. The horizontal axis represents a magnetic field, and the vertical axis represents the resistance of the element. The bias voltage applied was 1 V, and electrons flowed in a direction from the first ferromagnetic metal layer to the second ferromagnetic layer 7. From FIG. 10, it was found that the MR ratio was 79.0%, and the area resistance (RA) of the element was 0.75 WI(J mm². FIG. 11 is a diagram showing results of the evaluation of bias voltage dependency of the magnetoresistance effect of the magnetoresistance effect element of Example 1. It is found that in the magnetoresistance effect element of Example 1, the MR ratio is reduced with an increase in the bias voltage. From FIG. 11, it is found that the voltage ($V_{half}$) at which the MR ratio is reduced by half is 1 V.

Structure Analysis of Example 1

For structure analysis of the tunnel barrier layer, evaluation was performed with an electron diffraction image obtained using transmission electron beams. The structure of the barrier layer was examined through this method, and it was confirmed that there was no reflection from the {022} plane and the {111} plane shown in the ordered spinel structure. In addition, it was found that this barrier had a cubic structure in which the spinel structure was disordered.

Composition Analysis of Example 1

The composition of the tunnel barrier layer was analyzed using energy dispersive X-ray analysis (EDS). As a standard of the composition ratio, the sum of the contents of Al, Ga, and In was defined as 2, and relative amounts of Mg and Zn were compared to each other. As a result, Mg:Al:Ga:In=1.0: 0.67:0.73:0.6 was obtained. Quantitativity of oxygen was ignored since it is difficult to perform quantitative evaluation of oxygen. In general, the crystal structure can be maintained even in a case where the amount of oxygen deviates from the quantitative ratio in an oxide.

Example 2

The production method is similar to that in Example 1, but only the material for forming the tunnel barrier layer is different from that of Example 1. A film of 0.1 nm of Zn/0.4 nm of $Zn_{0.5}Al_{1.0}Ga_{1.1}In_{0.9}$ was formed by sputtering with a Zn target and a target having an alloy composition of $Zn_{0.5}Al_{1.0}Ga_{1.1}In_{0.9}$. Thereafter, the above-described sample was moved to an oxidation chamber of which the inside was kept in an ultrahigh vacuum of $1¼10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a film of 0.05 nm of Zn/0.3 nm of $Mg_{0.5}Al_{1.0}Ga_{1.1}In_{0.9}$/0.05 nm of Zn was formed. The above-described sample was moved to the oxidation chamber of which the inside was kept in an ultrahigh vacuum of $1¼10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

Characteristics of Example 2

Figure 12:
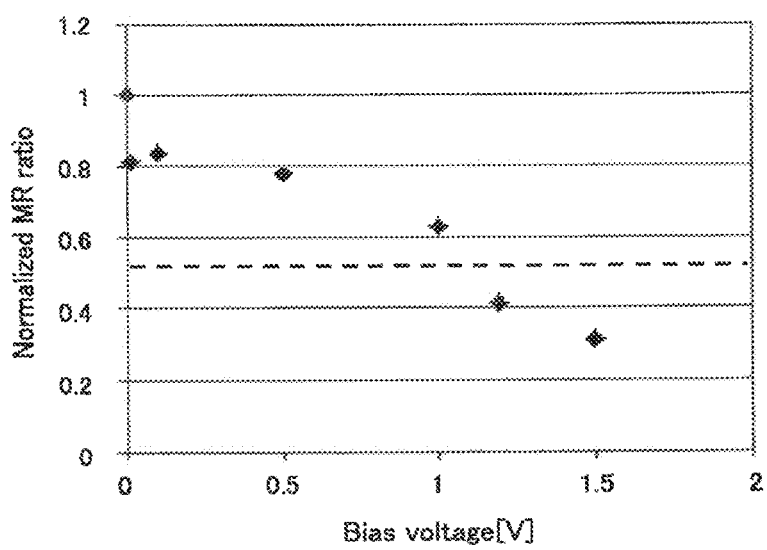
FIG. 12 is a diagram showing results of evaluation of bias voltage dependency of a magnetoresistance effect of a magnetoresistance effect element of Example 2.

As a result of the measurement of the magnetoresistance effect, it was found that in a case where the bias voltage was 1 V, the MR ratio was 85.6%, and the area resistance (RA) of the element was 0.72 WI(J mm$^2$. FIG. 12 is a diagram showing results of the evaluation of bias voltage dependency of the magnetoresistance effect of the magnetoresistance effect element of Example 2. It is found that in the magnetoresistance effect element of Example 2, the MR ratio is reduced with an increase in the bias voltage. From FIG. 12, it is found that the voltage ($V_{half}$) at which the MR ratio is reduced by half is 1.1 V. Relative amounts were compared to each other using EDS, and the result was Zn:Al:Ga: In=1.05:0.65:0.75:0.6. In addition, a cubic structure in which the spinel structure was disordered was confirmed from an electron beam diffraction image.

Example 3

The production method is similar to that in the Example 1, but only the material for forming the tunnel barrier layer is different from that of Example 1. A film of 0.1 nm of Mg/0.4 nm of $Mg_{0.5}Al_{1.9}Ga_{1.1}$ was formed by sputtering with a Mg target and a target having an alloy composition of $Mg_{0.5}Al_{1.9}Ga_{1.1}$. Thereafter, the above-described sample was moved to an oxidation chamber of which the inside was kept in an ultrahigh vacuum of $1¼10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a film of 0.05 nm of Mg/0.3 nm of $Mg_{0.5}Al_{1.9}Ga_{1.1}$/0.05 nm of Mg was formed. The above-described sample was moved to the oxidation chamber of which the inside was kept in an ultrahigh vacuum of $1¼10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

Characteristics of Example 3

Figure 13:
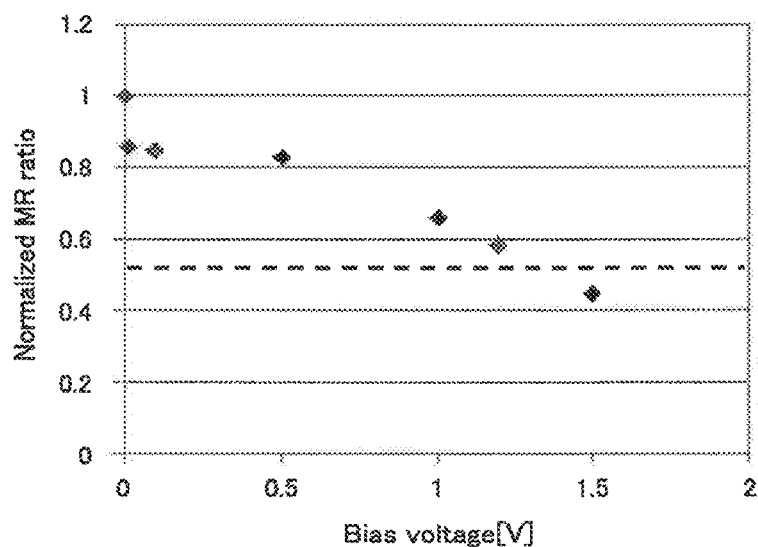
FIG. 13 is a diagram showing results of evaluation of bias voltage dependency of a magnetoresistance effect of a magnetoresistance effect element of Example 3.

As a result of the measurement of the magnetoresistance effect, it was found that in a case where the bias voltage was 1 V, the MR ratio was 128.5%, and the area resistance (RA) of the element was 0.69 WI(J mm$^2$. FIG. 13 is a diagram showing results of the evaluation of bias voltage dependency of the magnetoresistance effect of the magnetoresistance effect element of Example 3. It is found that in the magnetoresistance effect element of Example 2, the MR ratio is reduced with an increase in the bias voltage. From FIG. 13, it is found that the voltage ($V_{half}$) at which the MR ratio is reduced by half is 1.35 V. Relative amounts were compared to each other using EDS, and the result was Mg:Al:Ga=1.0: 1.35:0.65. In addition, a cubic structure in which the spinel structure was disordered was confirmed from an electron beam diffraction image.

Example 4

The production method is similar to that in the Example 1, but only the material for forming the tunnel barrier layer is different from that of Example 1. A film of 0.1 nm of Mg/0.4 nm of $Mg_{0.5}Al_{1.9}In_{1.1}$ was formed by sputtering with a Mg target and a target having an alloy composition of $Mg_{0.5}Al_{1.9}In_{1.1}$. Thereafter, the above-described sample was moved to an oxidation chamber of which the inside was kept in an ultrahigh vacuum of $1¼10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a film of 0.05 nm of Mg/0.3 nm of $Mg_{0.5}Al_{1.9}In_{1.1}$/0.05 nm of Mg was formed. The above-described sample was moved to the oxidation chamber of which the inside was kept in an ultrahigh vacuum of $1¼10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

Characteristics of Example 4

Figure 14:
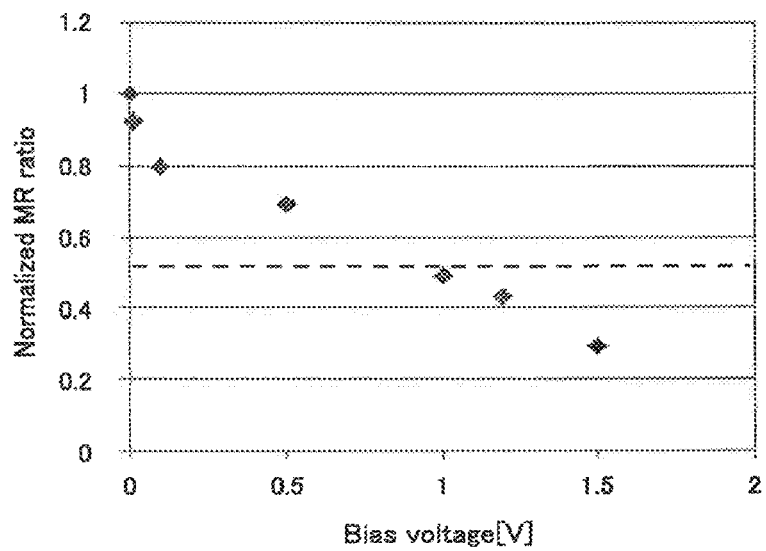
FIG. 14 is a diagram showing results of evaluation of bias voltage dependency of a magnetoresistance effect of a magnetoresistance effect element of Example 4.

As a result of the measurement of the magnetoresistance effect, it was found that in a case where the bias voltage was 1 V, the MR ratio was 70%, and the area resistance (RA) of the element was 0.67 WI(J mm$^2$. FIG. 14 is a diagram showing results of the evaluation of bias voltage dependency of the magnetoresistance effect of the magnetoresistance effect element of Example 4. It is found that in the magnetoresistance effect element of Example 4, the MR ratio is reduced with an increase in the bias voltage. From FIG. 14, it is found that the voltage ($V_{half}$) at which the MR ratio is reduced by half is 1 V. Relative amounts were compared to each other using EDS, and the result was Mg:Al:In=1.0:1.4:0.58. In addition, a cubic structure in which the spinel structure was disordered was confirmed from an electron beam diffraction image.

Example 5

The production method is similar to that in the Example 1, but only the material for forming the tunnel barrier layer is different from that of Example 1. A film of 0.1 nm of Mg/0.4 nm of $Mg_{0.5}Ga_{1.5}In_{1.5}$ was formed by sputtering with a Mg target and a target having an alloy composition of $Mg_{0.5}Ga_{1.5}In_{1.5}$. Thereafter, the above-described sample was moved to an oxidation chamber of which the inside was kept in an ultrahigh vacuum of $1 \times 10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a film of 0.05 nm of Mg/0.3 nm of $Mg_{0.5}Ga_{1.5}In_{1.5}$/0.05 nm of Mg was formed. The above-described sample was moved to the oxidation chamber of which the inside was kept in an ultrahigh vacuum of $1 \times 10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

Characteristics of Example 5

Figure 15:
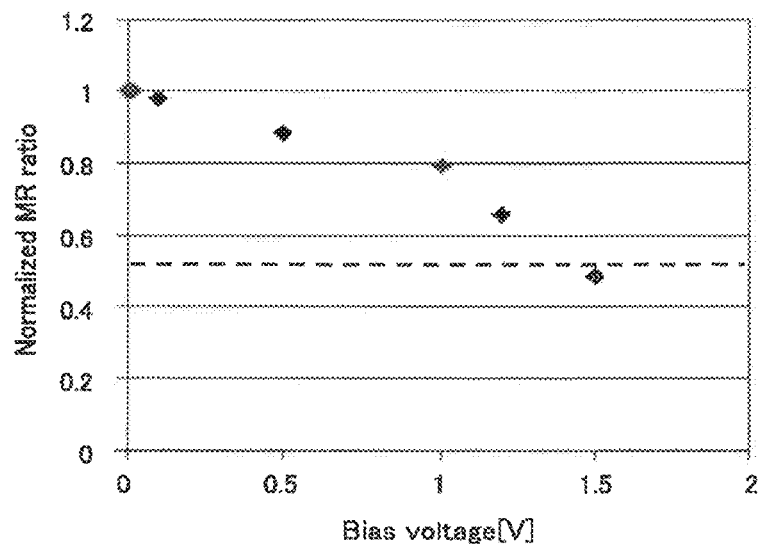
FIG. 15 is a diagram showing results of evaluation of bias voltage dependency of a magnetoresistance effect of a magnetoresistance effect element of Example 5.

As a result of the measurement of the magnetoresistance effect, it was found that in a case where the bias voltage was 1 V, the MR ratio was 132%, and the area resistance (RA) of the element was 0.65 WIΩ mm². FIG. 15 is a diagram showing results of the evaluation of bias voltage dependency of the magnetoresistance effect of the magnetoresistance effect element of Example 5. It is found that in the magnetoresistance effect element of Example 5, the MR ratio is reduced with an increase in the bias voltage. From FIG. 15, it is found that the voltage ($V_{half}$) at which the MR ratio is reduced by half is 1.5 V. Relative amounts were compared to each other using EDS, and the result was Mg:Ga:In=1.0:1.1:0.9. In addition, a cubic structure in which the spinel structure was disordered was confirmed from an electron beam diffraction image.

Example 6

The production method is similar to that in the Example 1, but only the material for forming the tunnel barrier layer is different from that of Example 1. A film of 0.05 nm of Mg/0.4 nm of $Mg_{0.5}Ga_{1.5}In_{1.5}$ was formed by sputtering a Mg target and a target having an alloy composition of $Mg_{0.5}Ga_{1.5}In_{1.5}$. Thereafter, the above-described sample was moved to an oxidation chamber of which the inside was kept in an ultrahigh vacuum of $1 \times 10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a film of 0.05 nm of Mg/0.3 nm of $Mg_{0.5}Ga_{1.5}In_{1.5}$/0.05 nm of Mg was formed. The above-described sample was moved to the oxidation chamber of which the inside was kept in an ultrahigh vacuum of $1 \times 10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

Characteristics of Example 6

Figure 16:
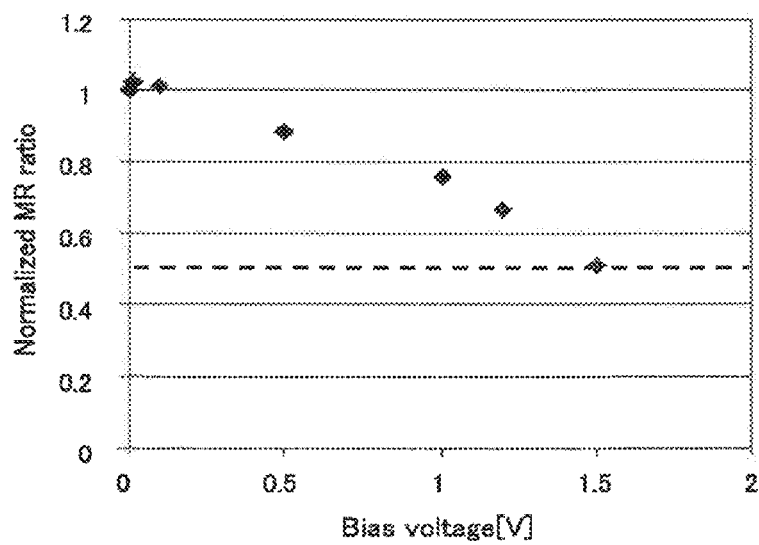
FIG. 16 is a diagram showing results of evaluation of bias voltage dependency of a magnetoresistance effect of a magnetoresistance effect element of Example 6.

As a result of the measurement of the magnetoresistance effect, it was found that in a case where the bias voltage was 1 V, the MR ratio was 146%, and the area resistance (RA) of the element was 0.62 WIΩ mm². FIG. 16 is a diagram showing results of the evaluation of bias voltage dependency of the magnetoresistance effect of the magnetoresistance effect element of Example 6. It is found that in the magnetoresistance effect element of Example 6, the MR ratio is reduced with an increase in the bias voltage. From FIG. 16, it is found that the voltage ($V_{half}$) at which the MR ratio is reduced by half is 1.5 V. Relative amounts were compared to each other using EDS, and the result was Mg:Ga:In=0.83:1.05:0.96. In addition, a cubic structure in which the spinel structure was disordered was confirmed from an electron beam diffraction image.

Example 7

The production method is similar to that in Example 6, but only the material for forming the first ferromagnetic metal layer is different from Example 6. A material having an alloy composition of $Co_2Mn_{0.7}Fe_{0.3}Si_{0.66}Al_{0.36}$ was used in place of CoFe to form a film. 12 nm of IrMn/10 nm of CoFe/0.8 nm of Ru/2 nm of CoFe/5 nm of $Co_2Mn_{0.7}Fe_{0.3}Si_{0.66}Al_{0.36}$ was formed in order as the first ferromagnetic metal layer. Only when a film was formed using the material having an alloy composition of $Co_2Mn_{0.7}Fe_{0.3}Si_{0.66}Al_{0.36}$, the substrate was heated at 450 degrees. In addition, before the formation of the tunnel barrier layer, the heat of the substrate was sufficiently radiated to lower the temperature of the substrate to about the room temperature, and then the subsequent film forming process was performed.

Characteristics of Example 7

Figure 17:
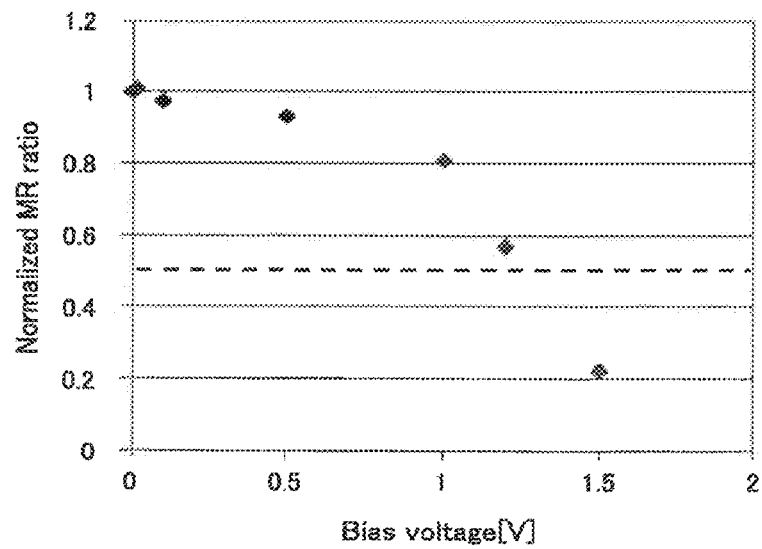
FIG. 17 is a diagram showing results of evaluation of bias voltage dependency of a magnetoresistance effect of a magnetoresistance effect element of Example 7.

As a result of the measurement of the magnetoresistance effect, it was found that in a case where the bias voltage was 1 V, the MR ratio was 182%, and the area resistance (RA) of the element was 0.65 WIΩ mm². FIG. 17 is a diagram showing results of the evaluation of bias voltage dependency of the magnetoresistance effect of the magnetoresistance effect element of Example 7. It is found that in the magnetoresistance effect element of Example 5, the MR ratio is reduced with an increase in the bias voltage. From FIG. 17, it is found that the voltage ($V_{half}$) at which the MR ratio is reduced by half is 1.25 V. In addition, a cubic structure in which the spinel structure was disordered was confirmed from an electron beam diffraction image.

Example 8

The production method is similar to that in Example 1, but only the material for forming the tunnel barrier layer is different from Example 1. a film with a thickness of 0.5 nm was formed by simultaneously sputtering with a target having an alloy composition of $Mg_{0.9}Al_2$ and a target having an alloy composition of $Mg_{0.9}Ga_2$. At this time, the contents of Al and Ga were adjusted so as to obtain an arbitrary composition ratio. Thereafter, the above-described sample was moved to an oxidation chamber of which the inside was kept in an ultrahigh vacuum of $1 \times 10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a target having an alloy composition of $Mg_{0.9}Al_2$ and a film with a thickness of 0.4 nm was formed by simultaneously sputtering with a target having an alloy composition of $Mg_{0.9}Ga_2$. At this time, the contents of Al and Ga were adjusted so as to obtain an arbitrary composition ratio. The above-described sample was moved to the oxidation chamber of which the inside was kept in an ultrahigh vacuum of $1 \times 10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

Characteristics of Example 8

Figure 18:
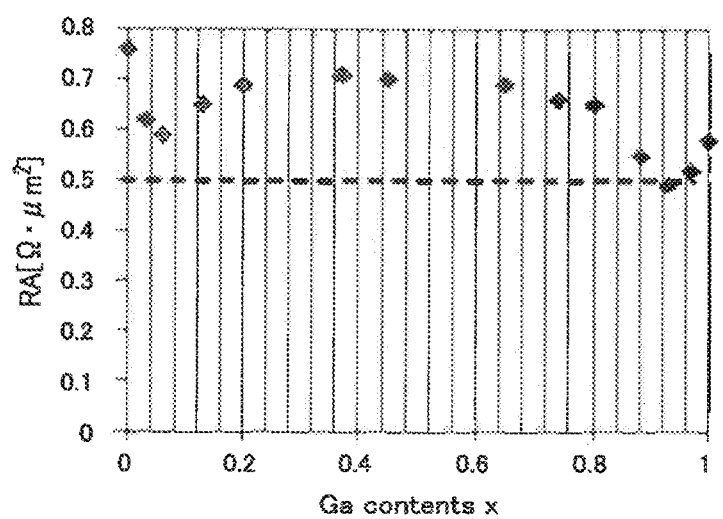
FIG. 18 is a diagram obtained by plotting RA obtained from results of measurement of a magnetoresistance effect of Example 8 and the amount of Ga in trivalent cations obtained from EDS.

FIG. 18 is a diagram obtained by plotting RA obtained from the results of the measurement of the magnetoresistance effect of Example 8 and the amount of Ga in the trivalent cations obtained from EDS. The composition ratio of Al to the sum of Mg and Zn was confirmed to be 0.9:2 at any composition ratio. The bias voltage is 1 V. In addition, a cubic structure in which the spinel structure was disordered was confirmed from an electron beam diffraction image. From FIG. 18, it is found that at a composition ratio of $Mg_{0.9}(Al_{1-x}Ga_x)_2O_4$, a region where RA is rapidly reduced is present in a region where a concentration x of Ga is greater than 0 and equal to or less than 0.2 and in a region where the concentration x of Ga is equal to or greater than 0.85. In addition, it is found that a minimum value is shown in a case where the concentration x of Ga is 0.06 and 0.93. In a region where the proportion of any one of Al, Ga, or In as a main component is 85% to less than 100%, RA is lower than in a case where the proportion of the main component is 100%. Regarding this, it can be thought that the substituted element imparts distortion to the crystal lattice, and thus a component contributing to conduction is imparted. Otherwise, the substituted element is thought to form an impurity level in a bandgap and to contribute to conduction.

Example 9

The production method is similar to that in Example 3, but only the method for forming the tunnel barrier layer is different from Example 3. Film formation was performed on a substrate provided with a thermal silicon oxide film using a magnetron sputtering method. A film of 0.1 nm of Mg/0.4 nm of $Mg_{0.5}Al_{1.9}Ga_{1.1}$ was formed by sputtering with a Mg target and a target having an alloy composition of $Mg_{0.5}Al_{1.9}Ga_{1.1}$.

Thereafter, the above-described sample was moved to an oxidation chamber of which the inside was kept in an ultrahigh vacuum of $1 \times 10^{-8}$ Pa or less, and the substrate was cooled to −70 to −30 degrees. Then, natural oxidation was performed by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a film of 0.05 nm of Mg/0.3 nm of $Mg_{0.5}Al_{1.9}Ga_{1.1}$/0.05 nm of Mg was formed. The above-described sample was moved to the oxidation chamber of which the inside was kept in an ultrahigh vacuum of $1 \times 10^{-8}$ Pa or less, and the substrate was cooled to −70 to −30 degrees. Then, natural oxidation and inductively coupled plasma oxidation were performed by introducing Ar and oxygen.

The natural oxidation time was 30 seconds, and the inductively coupled plasma oxidation time was 5 seconds. The partial pressure ratio of Ar to oxygen was 1 to 20, and the total gas pressure was 0.08 Pa.

Cross-Section Analysis of Example 9

A volume ratio of the lattice-matched part (lattice-matched portion) with respect to the volume of the entire tunnel barrier layer was calculated as described above using a cross-section transmission electron microscope (TEM) image and an image obtained by removing electron beam diffraction spots in a direction other than a stacking direction in an electron beam diffraction image obtained by Fourier-transforming the TEM image and by then performing inverse Fourier transformation.

Figure 22:
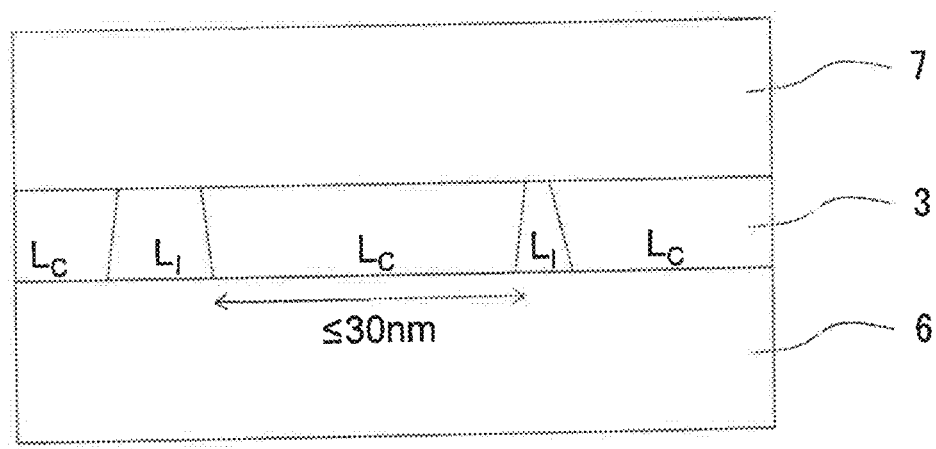
FIG. 22 is a diagram showing a structure of a cross-section when seen from a including a direction parallel to a stacking direction of Example 9.

FIG. 22 is a structural schematic diagram of a cross-section including a direction parallel to the stacking direction of Example 9. From the high-resolution cross-section TEM image obtained in Example 9, it was found that a size (width) of the film surface of the lattice-matched part of the tunnel barrier layer in a direction parallel thereto was 30 nm or less in any part. 30 nm is approximately 10 times the lattice constant of the CoFe alloy that is the material of the first ferromagnetic metal layer and the second ferromagnetic metal layer, and mutual interference of the spin-polarized electrons in a direction perpendicular to the tunneling direction before or after coherent tunneling can be thought to be intensified approximately 10 times the lattice constant.

Figure 23A:
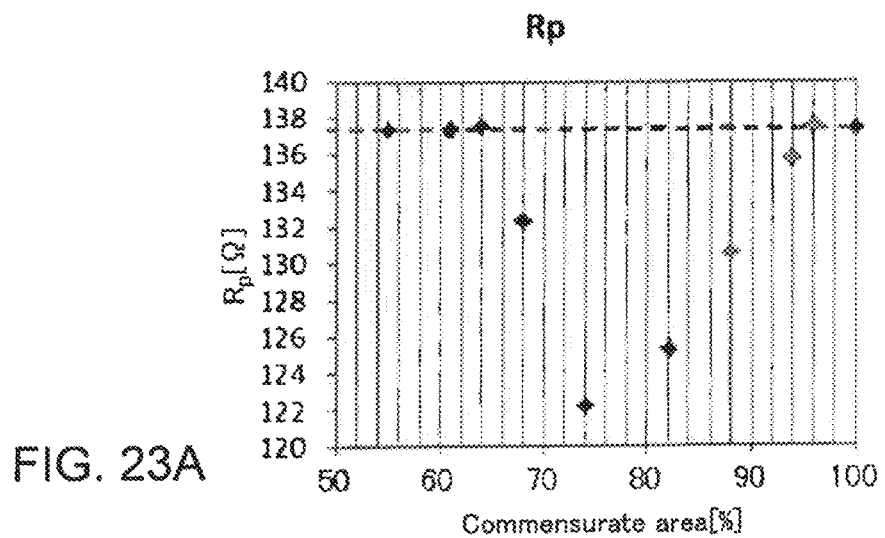
FIGS. 23(A), 23(B) and 23(C) are diagrams showing a proportion of a lattice-matched portion in which a tunnel barrier layer of Example 9 is lattice-matched with both of a first ferromagnetic metal layer and a second ferromagnetic metal layer, and characteristics of an element.
Figure 23B:
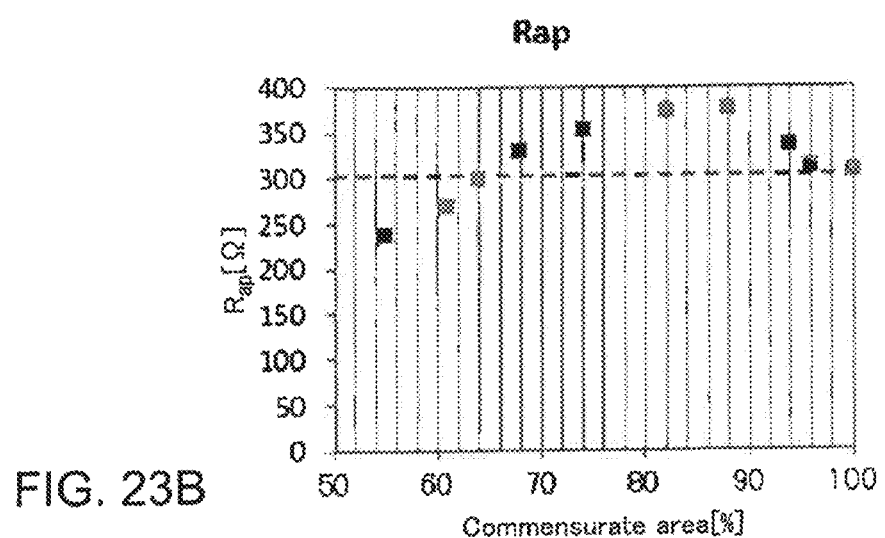
Figure 23C:
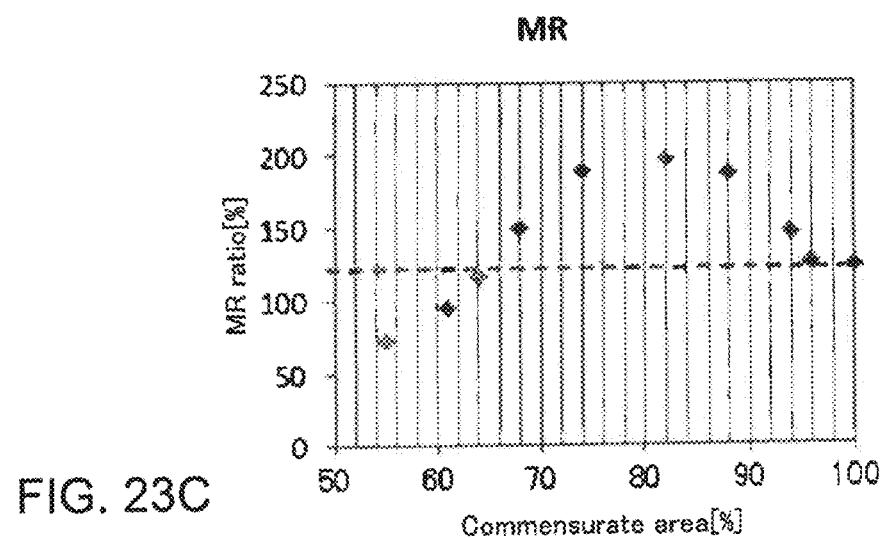

FIGS. 23(A), 23(B) and 23(C) are diagrams showing a volume ratio of the lattice-matched part (lattice-matched portion) with respect to the volume of the entire tunnel barrier layer of Example 9 and characteristics of the element. FIG. 23(A) is a diagram showing element resistance (Rp) when magnetization directions of the first ferromagnetic metal layer and the second ferromagnetic metal layer are parallel to each other. FIG. 23(B) is a diagram showing element resistance (Rap) when magnetization directions of the first ferromagnetic metal layer and the second ferromagnetic metal layer are anti parallel to each other. FIG. 23(C) is a diagram showing a magnetoresistance ratio of the element. The Rp tends to be reduced when the proportion of the lattice-matched part in which the tunnel barrier layer is lattice-matched to both of the first ferromagnetic metal layer and the second ferromagnetic metal layer is in the range of 65% to 95%. Regarding this, in a case where the tunnel barrier layer is completely lattice-matched, spin-polarized electrons interfere with each other during passing through the tunnel barrier layer, and thus it is thought that the electrons do not easily pass through the tunnel barrier layer. In contrast, in a case where the lattice-matched parts, in which lattices are matched, partially exists, the interference of spin-polarized electrons during passing through the tunnel barrier layer is appropriately cut in a part in which lattices are not matched, and thus the spin-polarized electrons easily pass through the tunnel barrier layer. As a result, it is thought that a tendency of a reduction in the Rp is observed. At the same time, a tendency of a slight increase in the Rap is observed when the proportion of the lattice-matched portion is in the range of 65% to 95%. This indicates that even when the magnetization directions of the first ferromagnetic metal layer and the second ferromagnetic metal layer are antiparallel to each other, the interference between domains is eased, and it is found that the spin-polarized electrons passing through the tunnel barrier layer are magnetically scattered.

Comparative Example 1

The production method is similar to that in Example 1, but only the material for forming the tunnel barrier layer is different from Example 1. A film of Mg with a thickness of 0.45 nm was formed by sputtering with a Mg target. Thereafter, the above-described sample was moved to an oxidation chamber of which the inside was kept in an ultrahigh vacuum of $1 \times 10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a film of Mg with a thickness of 0.4 nm was formed. The above-described sample was moved to the oxidation chamber of which the inside was kept in an ultrahigh vacuum of $1 \times 10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

Characteristics of Comparative Example 1

Figure 19:
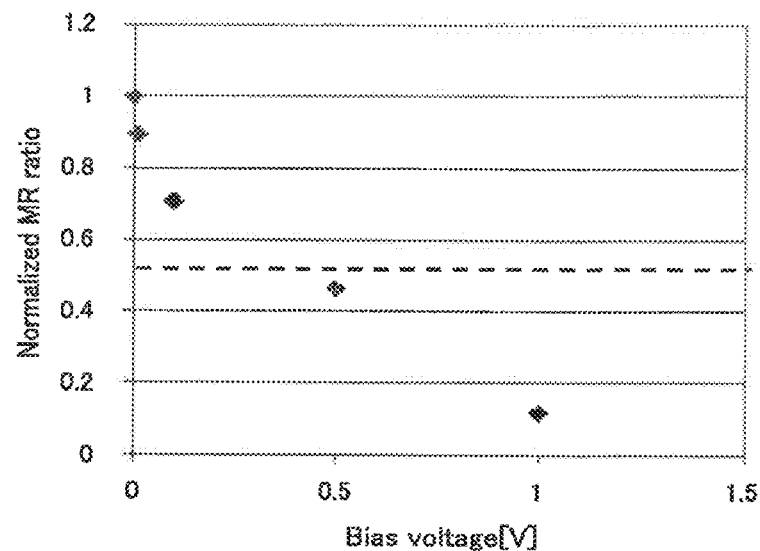
FIG. 19 is a diagram showing results of evaluation of bias voltage dependency of a magnetoresistance effect of a magnetoresistance effect element of Comparative Example 1.

As a result of the measurement of the magnetoresistance effect, it was found that in a case where the bias voltage was 1 V, the MR ratio was 27%, and the area resistance (RA) of the element was 0.6 WIΩ mm². FIG. 19 is a diagram showing results of the evaluation of bias voltage dependency of the magnetoresistance effect of the magnetoresistance effect element of comparative Example 1. It is found that in the magnetoresistance effect element of Comparative Example 1, the MR ratio is reduced with an increase in the bias voltage. From FIG. 19, it is found that the voltage ($V_{half}$) at which the MR ratio is reduced by half is 0.45 V. In addition, a spinel structure was confirmed from an electron beam diffraction image.

Comparative Example 2

The production method is similar to that in Example 1, but only the material for forming the tunnel barrier layer is different from Example 1. a film of 0.05 nm of Mg/0.05 nm of Zn/0.25 nm of $Mg_{0.15}Zn_{0.25}Al_2$/0.1 nm of Al was formed by sputtering with a Mg target, an Al target, and a target having an alloy composition of $Mg_{0.5}Zn_{0.5}Al_2$. Thereafter, the above-described sample was moved to an oxidation chamber of which the inside was kept in an ultrahigh vacuum of $1 \times 10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a film of 0.05 nm/0.05 nm of Zn/0.2 nm of $Mg_{0.15}Zn_{0.25}Al_2$/0.1 nm of Al was formed. The above-described sample was moved to the oxidation chamber of which the inside was kept in an ultrahigh vacuum of $1 \times 10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

Characteristics of Comparative Example 2

Figure 20:
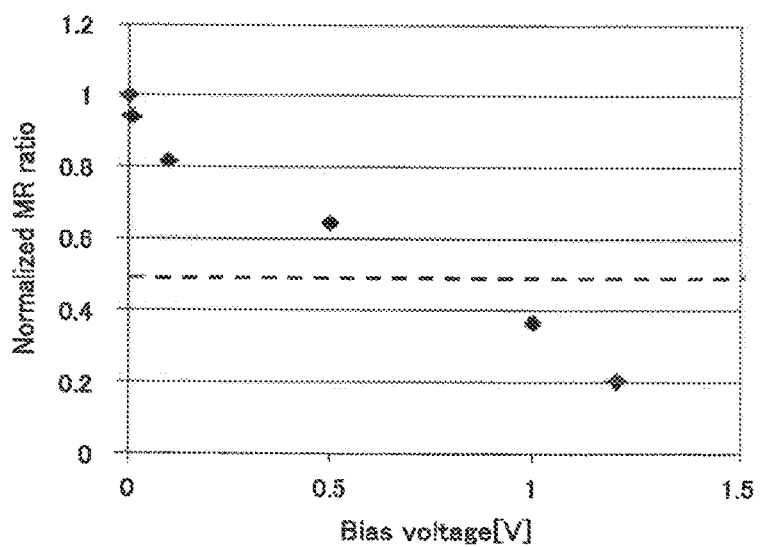
FIG. 20 is a diagram showing results of evaluation of bias voltage dependency of a magnetoresistance effect of a magnetoresistance effect element of Comparative Example 2.

As a result of the measurement of the magnetoresistance effect, it was found that in a case where the bias voltage was 1 V, the MR ratio was 46%, and the area resistance (RA) of the element was 0.8 WIΩ mm². FIG. 20 is a diagram showing results of the evaluation of bias voltage dependency of the magnetoresistance effect of the magnetoresistance effect element of comparative Example 2. It is found that in the magnetoresistance effect element of Comparative Example 2, the MR ratio is reduced with an increase in the bias voltage. From FIG. 20, it is found that the voltage ($V_{half}$) at which the MR ratio is reduced by half is 0.7 V. Relative amounts were compared to each other using EDS, and the result was Mg:Zn:Al=0.5:0.5:2. In addition, a spinel structure was confirmed from an electron beam diffraction image.

Comparison of Examples with Comparative Examples

Table 1 shows the examples and the comparative examples.

TABLE 1

|  | RA [Ω · μm²] | MR Ratio [%] | $V_{half}$ [V] |
| --- | --- | --- | --- |
| EXAMPLES |  |  |  |
| EXAMPLE 1 | 0.75 | 79 | 1.0 |
| EXAMPLE 2 | 0.72 | 85 | 1.1 |
| EXAMPLE 3 | 0.69 | 128 | 1.35 |
| EXAMPLE 4 | 0.67 | 69 | 1.0 |
| EXAMPLE 5 | 0.65 | 132 | 1.5 |
| EXAMPLE 6 | 0.62 | 146 | 1.5 |
| EXAMPLE 7 | 0.62 | 182 | 1.25 |
| COMPARATIVE EXAMPLES |  |  |  |
| COMPARATIVE EXAMPLES 1 | 0.59 | 27 | 0.45 |
| COMPARATIVE EXAMPLES 2 | 0.80 | 46 | 0.70 |

In a case that Examples are compared with Comparative Examples, it is found that Examples have better characteristics than Comparative Examples in terms of both of the MR ratio and $V_{half}$. Particularly, in Examples, $V_{half}$ is improved approximately twice in comparison to a case where $MgMg_2O_4$ of Comparative Example 2 is used for a tunnel barrier layer. In addition, there is a tendency that the RA is reduced and the MR ratio is improved by substituting a part of $Al^{3+}$ with gallium or indium.

Examples can be divided into two types. One type is related to Examples in which some trivalent cations are substituted with gallium and indium. The other type is related to Examples in which some trivalent cations are substituted with gallium or indium, or a part of $Ga^{3+}$ is substituted with indium. Regarding one of these types, in Examples in which a part of $Al^{3+}$ is substituted with gallium or indium, or $Ga^{3+}$ is partially substituted with indium, the MR ratio is higher and $V_{half}$ is also higher than in the examples in which some trivalent cations are substituted with gallium and indium. In addition, in Example 4, the MR ratio is low. Here, the ionic radiuses of the trivalent cations are shown in Table 2.

TABLE 2

| ION | IONIC RADIUS [Å] |
|---|---|
| $Al^{3+}$ | 0.535 |
| $Ga^{3+}$ | 0.62 |
| $In^{3+}$ | 0.8 |

The value of the ionic radius is quoted from Non Patent Document 2. In Examples 1, 2, and 4, the difference in ionic radius between the trivalent cations contained in the tunnel barrier layer is up to $0.265_i$, and in Examples 3, 5, 6, and 7, the difference in ionic radius between the trivalent cations is up to $0.18_i$. In a case where the difference in ionic radius is small, there is no reason for the cations to be periodically arranged since these are regarded to be equivalent in the crystal structure. Thus, the trivalent cations are randomly disposed in the crystal. In a case where the difference in ionic radius is large, the cations are relaxed as much as possible in the crystal lattice, and thus the crystal lattice is stabilized in a case where the cations are periodically arranged.

That is, the trivalent cations are likely to be periodically arranged. From these facts, it is found that the characteristics are improved in a case where the difference in ionic radius between the divalent cations of the plural non-magnetic elements is $0.2_i$ or less.

INDUSTRIAL APPLICABILITY

The invention can be applied to a magnetoresistance effect element that obtains a higher MR ratio than TMR elements using a conventional spinel tunnel barrier at a high bias voltage.

DESCRIPTION OF THE REFERENCE SYMBOLS

100: MAGNETORESISTANCE EFFECT ELEMENT
1: SUBSTRATE
2: UNDERLAYER
3: TUNNEL BARRIER LAYER
4: CAP LAYER
5: ELECTRODE LAYER
6: FIRST FERROMAGNETIC METAL LAYER
7: SECOND FERROMAGNETIC METAL LAYER
8: ELECTRODE PAD
71: CURRENT SOURCE
72: VOLTMETER

The invention claimed is:

1. A method of manufacturing a magnetoresistance effect element having a laminated body, in which a first ferromagnetic metal layer, a tunnel barrier layer and a second ferromagnetic metal layer are laminated in an order, the tunnel barrier layer being made of a compound in a spinel structure, the method comprising the step of forming the tunnel barrier layer by repeating a process of forming a metal layer and a process of oxidizing the metal layer, wherein the laminated body is provided on a substrate,
the process of oxidizing the metal layer is performed after cooling the substrate to −70° C. to −30° C.,
wherein the laminated body is provided on the substrate indirectly via an intermediate layer,
wherein the intermediate layer is an under-layer,
wherein the under-layer is made of a layer having a stacked structure with a combination of two or more of layers of:
a nitride layer having a (001)-oriented NaCl structure and containing at least one element selected from the group consisting of T i, Zr, Nb, V, Hf, Ta, Mo, W, B, Al, and Ce;
a (002)-oriented perovskite conductive oxide layer made of ABO3;
an oxide layer having a (001)-oriented NaCl structure and containing at least one element selected from the group consisting of Mg, AI, and Ce; and
a layer having a (001)-oriented tetragonal or cubic structure and containing at least one element selected from the group consisting of Al, Cr, Fe, Co, Rh, Pd, Ag, Ir, Pt, Au, Mo, and W.

2. The method of manufacturing a magnetoresistance effect element according to claim 1, wherein the laminated body is provided on the substrate directly.

3. The method of manufacturing a magnetoresi tance effect element according to the claim 1, wherein the under-layer is made of a conductive material.

4. The method of manufacturing a magnetoresi tance effect element according to the claim 1, wherein the under-layer is made of an insulating material.

5. The method of manufacturing a magnetoresi tance effect element according to the claim 1, wherein the under-layer is made of a nitride layer having a (001)-oriented NaCl structure and containing at least one element selected from the group consisting of Ti, Zr, Nb, V, Hf, Ta, Mo, W, B, Al, and Ce.

6. The method of manufacturing a magnetoresi tance effect element according to the claim 1, wherein the under-layer is made of a (002)-oriented perovskite conductive oxide layer made of $ABO_3$.

7. The method of manufacturing a magnetoresi tance effect element according to the claim 1, wherein the under-layer is made of an oxide layer having a (001)-oriented NaCl structure and containing at least one element selected from the group consisting of Mg, Al, and Ce.

8. The method of manufacturing a magnetoresi tance effect element according to the claim 1, wherein the under-layer is made of a layer having a (001)-oriented tetragonal or cubic structure and containing at least one element selected from the group consisting of Al, Cr, Fe, Co, Rh, Pd, Ag, Ir, Pt, A u, Mo, and W.

* * * * *